(12) United States Patent
Horii

(10) Patent No.: US 8,497,539 B2
(45) Date of Patent: Jul. 30, 2013

(54) SEMICONDUCTOR DEVICE AND ITS MANUFACTURING METHOD

(75) Inventor: Yoshimasa Horii, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/403,321

(22) Filed: Feb. 23, 2012

(65) Prior Publication Data

US 2012/0153368 A1 Jun. 21, 2012

Related U.S. Application Data

(62) Division of application No. 11/515,875, filed on Sep. 6, 2006, now Pat. No. 8,222,683.

(30) Foreign Application Priority Data

Jan. 24, 2006 (JP) .................. 2006-015336

(51) Int. Cl.
*H01L 27/108* (2006.01)
(52) U.S. Cl.
USPC ........... 257/296; 257/300; 257/306; 257/310; 257/311; 257/532
(58) Field of Classification Search
USPC .................. 257/296, 300, 306, 310, 311, 532
See application file for complete search history.

(56) References Cited

U.S. PATENT DOCUMENTS

| 6,303,478 B1 | 10/2001 | Nakamura et al. | |
|---|---|---|---|
| 6,358,755 B1 | 3/2002 | Evans | |
| 6,376,304 B1 * | 4/2002 | Matsuoka et al. | 438/253 |
| 6,888,735 B2 | 5/2005 | Nishihara | |
| 6,952,028 B2 | 10/2005 | Lee et al. | |
| 7,547,558 B2 | 6/2009 | Okita et al. | |
| 2003/0201478 A1 | 10/2003 | Tani et al. | |
| 2003/0213985 A1 * | 11/2003 | Hase | 257/295 |
| 2005/0093147 A1 * | 5/2005 | Tu | 257/734 |
| 2005/0110065 A1 * | 5/2005 | Uchiyama et al. | 257/296 |
| 2005/0244988 A1 | 11/2005 | Wang et al. | |
| 2006/0138515 A1 * | 6/2006 | Ozaki | 257/306 |
| 2008/0072792 A1 | 3/2008 | Yanagisawa et al. | |

FOREIGN PATENT DOCUMENTS

| EP | 1020919 A2 | 7/2000 |
|---|---|---|
| JP | 10-256508 A | 9/1998 |
| JP | 2000-208740 A | 7/2000 |
| JP | 2002-033459 A | 1/2002 |
| JP | 2004-296682 A | 10/2004 |
| JP | 2005-183843 A | 7/2005 |

OTHER PUBLICATIONS

Japanese Office Action dated Aug. 30, 2010, issued in corresponding Japanese Patent Application No. 2006-015336.
Korean Office Action dated Mar. 20, 2007, issued in corresponding Korean Patent Application No. 10-2006-0070287.

* cited by examiner

*Primary Examiner* — N. Drew Richards
*Assistant Examiner* — Joannie A Garcia
(74) *Attorney, Agent, or Firm* — Westerman, Hattori, Daniels & Adrian, LLP

(57) ABSTRACT

To realize miniaturization/high integration and increase in the amount of accumulated charges, and to give a memory structure having a high reliability. A 1 transistor 1 capacitor (1T1C) structure having 1 ferroelectric capacitor structure and 1 selection transistor every memory cell is adopted, and respective capacitor structures are disposed respectively in either one layer of interlayer insulating films of 2 layers having different heights from the surface of a semiconductor substrate.

3 Claims, 25 Drawing Sheets

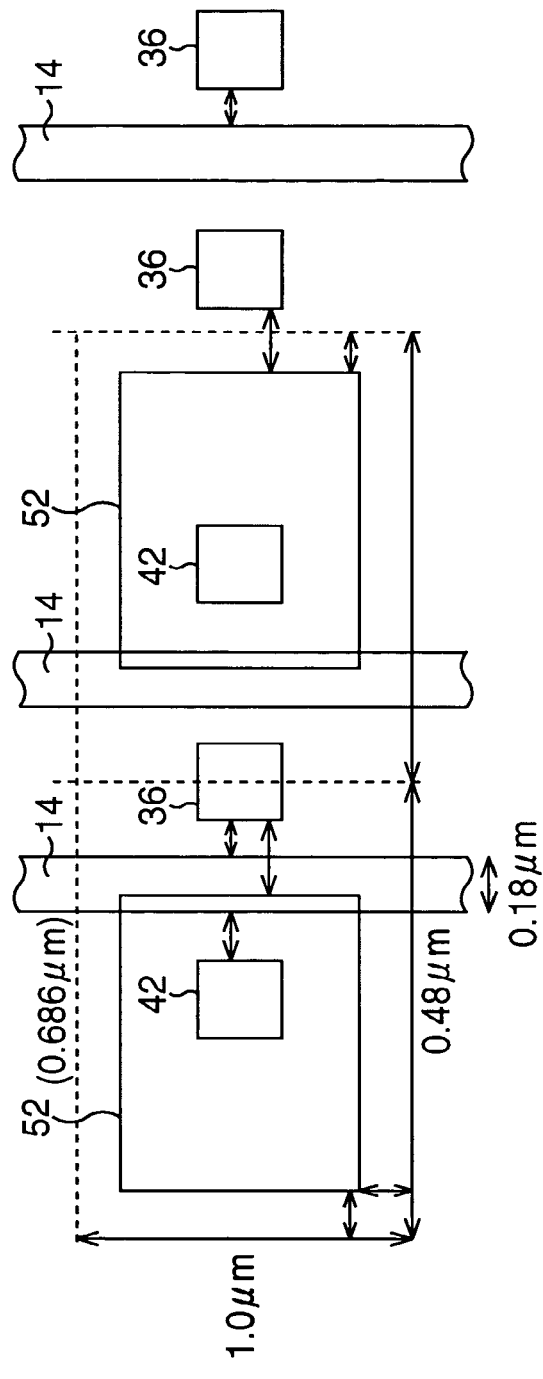
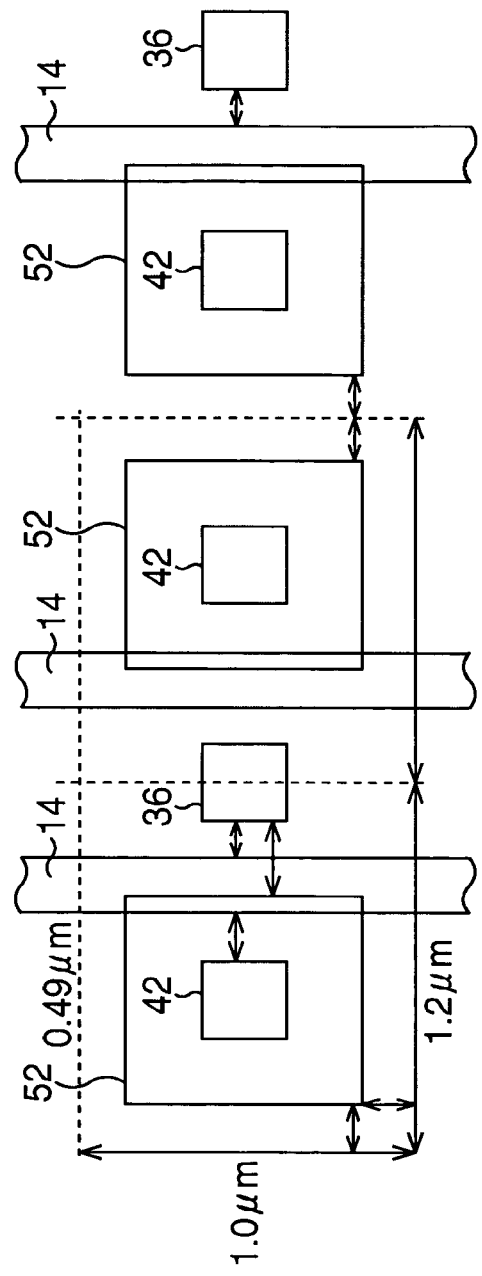
FIG. 8A
FIG. 8B

SEMICONDUCTOR DEVICE AND ITS MANUFACTURING METHOD

CROSS-REFERENCE TO RELATED APPLICATIONS

This application is a divisional of U.S. application Ser. No. 11/515,875, filed on Sep. 6, 2006, which in turn is based upon and claims the benefit of priority from the prior Japanese Patent Application No. 2006-015336, filed on Jan. 24, 2006, the entire contents of which are incorporated herein by reference.

BACKGROUND OF THE INVENTION

1. Field of the Invention

The present invention relates to a semiconductor device having a capacitor structure sandwiching a ferroelectric film between a lower electrode and an upper electrode, and to its manufacturing method. In particular, it is preferably applied to a semiconductor device having a ferroelectric capacitor structure in which the dielectric film is a ferroelectric film having ferroelectric characteristics.

2. Description of the Related Art

Recently, development is proceeded with a ferroelectric memory (FeRAM) holding information in a ferroelectric capacitor structure utilizing polarization inversion of a ferroelectric substance. The ferroelectric memory is superior to a flash memory and an EEPROM in low power consumption, the number of times of rewriting and speed of rewriting, and used for such applications as IC cards and SIMs. Further, since the ferroelectric memory is a nonvolatile memory that does not lose held information when a power source is switched off and can be expected to realize high integration, high speed driving, high durability and low power consumption, it particularly attracts attention.

[Patent Document 1] Japanese Patent No. 3591497

Recently, miniaturization/high integration of a semiconductor device proceeds more and more, and there also raises similar expectations for a FeRAM. Further, increase in an amount of accumulated charges is also requested for such semiconductor memory as a FeRAM. Thus, for a FeRAM, in order to satisfy such conflicting request as miniaturization/high integration, and increase in an amount of accumulated charges, increasing in an occupying area of a ferroelectric capacitor structure while reducing memory cell size is required.

In view of this, Patent Document 1 discloses such constitution as plural ferroelectric capacitor structures formed in plural 2-layered structures having a common upper or lower electrode in column direction. However, since the technique of Patent Document 1 has a common upper or lower electrode as described above, it is restricted to a special constitution in which 1 selection transistor is disposed for plural ferroelectric capacitor structures in column direction. In the constitution, carrying out sufficient integration of a memory cell is difficult.

SUMMARY OF THE INVENTION

The present invention was completed with the view of the above problem, and its object is to provide a semiconductor device capable of realizing miniaturization/high integration and increase in an amount of accumulated charges and giving a memory structure with a high reliability, and its manufacturing method.

The semiconductor device of the present invention is formed above a semiconductor substrate, wherein 1 memory cell is constituted by including 1 capacitor structure sandwiching a dielectric film with a lower electrode and an upper electrode, and 1 transistor for selecting the capacitor structure, and the capacitor structure of respective memory cells is formed respectively in either 1 layer of at least 2 interlayer insulating films having different heights from the surface of the semiconductor substrate.

The manufacturing method of the semiconductor device of the present invention is a method of manufacturing a semiconductor device provided with plural memory cells, including the steps of forming transistors above a semiconductor substrate, and forming, above the transistor, 1 capacitor structure sandwiching a dielectric film with a lower electrode and an upper electrode so as to correspond to one of the transistors, wherein the capacitor structure of the respective memory cells is formed respectively in either 1 layer of at least 2 interlayer insulating films having different heights from the surface of the semiconductor substrate.

BRIEF DESCRIPTION OF THE DRAWINGS

FIGS. 8A to 8B are general plan views showing the layout in the vicinity of a ferroelectric capacitor structure of a FeRAM.

DETAILED DESCRIPTION OF THE PREFERRED EMBODIMENTS

—Basic Gist of the Present Invention—

Figure 1A:
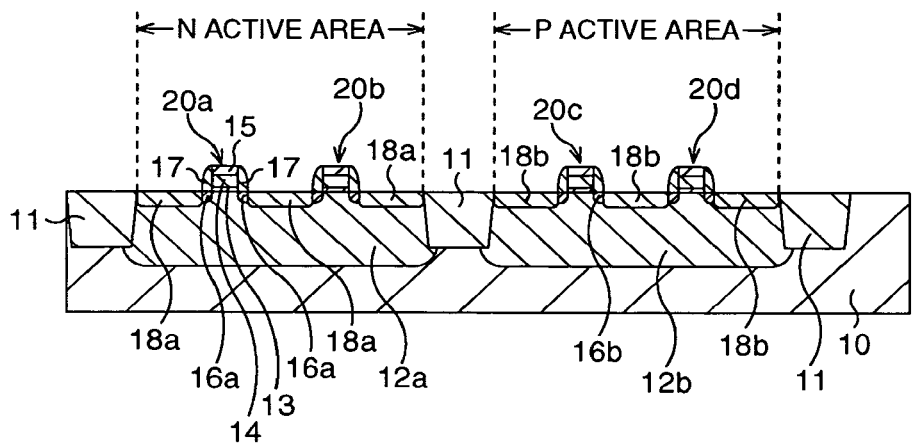
FIGS. 1A to 1C are general cross-sectional views showing the constitution of the stack type FeRAM according to the first embodiment along with its manufacturing method according to the order of the steps.

In the present invention, as a memory cell configuration realizing a significant increase in an amount of accumulated charges while intending miniaturization/high integration of a semiconductor memory represented by a FeRAM as far as possible, a 1 transistor 1 capacitor (1T1C) structure having 1 ferroelectric capacitor structure and 1 selection transistor every memory cell is adopted, and respective capacitor structures are disposed respectively in either 1 layer of at least 2 interlayer insulating films having different heights from the surface of a semiconductor substrate.

The 1T1C structure is a structure capable of realizing a further high integration degree. In the present invention, while intending increase in the integration degree of a memory cell as far as possible on the premise of a semiconductor memory of this 1T1C structure, by disposing respective capacitor structures in a hierarchical shape of at least 2 layers having different heights from the surface of a semiconductor substrate, it becomes possible to increase the occupation area of a capacitor structure in the memory cell.

The present invention can be applied to both of stack type semiconductor memories provided with respective connecting plugs to the downside of a lower electrode and the upside of an upper electrode of respective capacitor structures, and stack type semiconductor memories provided with respective connecting plugs to the upside of a lower electrode and the upside of an upper electrode of respective capacitor structures. As to the semiconductor memory, application to a FeRAM mainly having a ferroelectric dielectric film (ferroelectric film) as a capacitor insulating film is preferred.

Incidentally, for a FeRAM, influence on the ferroelectric film caused by generation of hydrogen becomes problematic. That is, when hydrogen intrudes into a ferroelectric film, it reacts with oxygen of the ferroelectric film to form an oxygen defect in the ferroelectric film to lower crystallinity. Further, a similar phenomenon generates due to a prolonged use of a ferroelectric memory, too. As the result, there generates such performance degradation of the ferroelectric capacitor structure as the falloff of an amount of remnant polarization or dielectric constant. Further, by such intrusion of hydrogen, performance of a transistor and the like, not restricted to the ferroelectric capacitor structure, may degrade.

Main source origins of hydrogen influencing the ferroelectric film in this manner include (1) intrusion of moisture from the outside, and (2) generation of hydrogen from a connecting plug.

(1) When moisture intrudes from the outside via an interlayer insulating film having a high affinity with water such as a silicon oxide film, the moisture degrades to hydrogen and oxygen in a high temperature process during film forming the interlayer insulating film or a metal wiring. This hydrogen intrudes into a ferroelectric film.

(2) When forming a connecting plug, for example, using W as a material, hydrogen is taken in the connecting plug by deposition of W or the like by a CVD method or the like. The hydrogen intrudes into a ferroelectric film.

In addition, for a FeRAM, after patterning a ferroelectric film, it is necessary to carry out an oxygen annealing treatment in order to recover damage given to the ferroelectric film at etching. However, the oxygen annealing treatment may result in abnormal oxidation to a connecting plug.

In the present invention, in respective stack type and planar type FeRAMs, in order to suppress intrusion of hydrogen into a ferroelectric film mainly caused by (1), in respective interlayer insulating films, a protective insulating film using alumina or the like as a material is formed so as to cover respective capacitor structures.

Further, in a stack type FeRAM, in order to realize suppression of intrusion of hydrogen mainly cased by (2) into a ferroelectric film, and suppression of abnormal oxidation of a connecting plug, following (a), (b) constitutions are adopted.

(a) Between a lower electrode and a connecting plug of respective capacitor structures, a conductive protective base film, for example, having the same shape as the lower electrode is formed. As the protective base film, a single layer of TiAlN, a laminated structure of TiN and TiAlN, or the like is preferred. Incidentally, instead of forming the protective base film, the lower electrode (such as Ir) of the ferroelectric capacitor structure may be formed in a thickness larger than normal one.

(b) Since, in the present invention, respective ferroelectric capacitor structures of a FeRAM are disposed in respective interlayer insulating films of at least 2 layers, as a specialized structure for the constitution, a conductive protective base film is formed into a one-layer structure sandwiched between 2 interlayer insulating films adjacently laminated. Respective protective base films constituting the layer structure are preferably formed between a lower electrode and the connecting plug for a ferroelectric capacitor of the upper interlayer insulating film, between an upper electrode and the connecting plug for a ferroelectric capacitor of the lower interlayer insulating film, and between the upper and lower connecting plugs (at least one region thereof), for example, in a shape matching with the upper face of the connecting plug. As the protective base film, use of a single layer of TiAlN, a laminated structure of TiN and TiAlN, Ir or the like as a material is preferred.

As described above, by forming the protective insulating film or various types of protective base films, it becomes possible to suppress adverse influence on the ferroelectric film caused by moisture/hydrogen that is particularly notably observed for a FeRAM as far as possible, to suppress abnormal oxidation of a connecting plug, thereby realizing a ferroelectric capacitor having a high reliability.

VARIOUS PREFERRED EMBODIMENTS THE PRESENT INVENTION IS APPLIED TO

Hereinafter, various preferred embodiments in which the present invention is applied to a FeRAM of the 1T1C structure will be described in detail in reference to the drawings. Incidentally, for the sake of simplicity of description, constitution of a FeRAM in respective embodiments will be described along with its manufacturing method.

First Embodiment

In a first embodiment, the constitution of a stack type FeRAM and its manufacturing method are described.

FIGS. 1A to 7B are general cross-sectional views showing the constitution of the stack type FeRAM according to the first embodiment along with its manufacturing method according to the order of the steps.

At the beginning, as shown in FIG. 1A, the selection transistor, in the illustrated example, transistor structures 20a, 20b, 20c, 20d are formed on a silicon semiconductor substrate 10. Here, the transistor structures 20a, 20b, 20c, 20d constitute CMOS transistors, wherein 20a, 20b become NMOS transistors, and 20c, 20d become PMOS transistors.

For details, firstly, an element isolating structure 11 is formed on the surface layer of the silicon semiconductor substrate 10, for example, by an STI (Shallow Trench Isolation) method to determine an element active area.

Next, a resist mask (not shown) covering the element active area of transistor structures 20c, 20d to become PMOS transistors (hereinafter, referred to as the P active area) and having an aperture capable of exposing the formation area of transistor structures 20a, 20b to become NMOS transistors (hereinafter, referred to as the N active area) is formed.

Then, by using the resist mask, a P type impurity, here boron (B) is ion-implanted to the N active area, for example, under such conditions as a dose amount of $3.0 \times 10^{13}/cm^2$ and an acceleration energy of 300 keV to form a P type well 12a in the N active area. The resist mask is removed by an asking treatment or the like.

Next, a resist mask (not shown) covering the N active area and having an aperture capable of exposing the P active area is formed.

Then, using the resist mask, an N type impurity, here phosphorous (P) is ion-implanted into the P active area, for example, under such conditions as a dose amount of $3.0 \times 10^{13}/cm^2$ and an acceleration energy of 600 keV to form an N type well 12b in the P active area. The resist mask is removed by an asking treatment or the like.

Next, thin gate insulating films 13 having a thickness of around 3.0 nm are formed on the P, N active areas respectively by thermal oxidation or the like, and on the gate insulating film 13 is deposited a polycrystalline silicon film having a thickness of around 180 nm and, for example, a silicon nitride film having a thickness of around 29 nm by a CVD method. Then, by processing the silicon nitride film, the polycrystalline silicon film and the gate insulating film 13 into an electrode shape by lithography and subsequent dry etching, gate electrodes 14 are pattern-formed respectively on the gate insulating films 13 in the P, N active areas. Simultaneously, a cap film 15 composed of a silicon nitride film is pattern-formed on respective gate electrodes 14.

Next, a resist mask (not shown) covering the P active area and having an aperture capable of exposing the N active area is formed.

Then, using the resist mask and the cap film 15 as a mask, an N type impurity, here As is ion-implanted into the N active area, for example, under such conditions as a dose amount of $5.0 \times 10^{14}/cm^2$ and an acceleration energy of 10 keV to form a so-called LDD area 16a.

Next, for example, a silicon oxide film is deposited by a CVD method on the whole surface, and the silicon oxide film is subjected to so-called etch back to form a sidewall insulating film 17 while leaving the silicon oxide film only on the side faces of the gate electrode 14 and the cap film 15 in the N active area.

Next, using the resist mask, the cap film 15 and the sidewall insulating film 17 as a mask, an N type impurity, here phosphorous (P) is ion-implanted into the N active area under such conditions as giving a higher impurity concentration than the LDD area 16a, for example, a dose amount of $5.0 \times 10^{14}/cm^2$ and an acceleration energy of 13 keV to form a source/drain area 18a to be overlapped to the LDD area 16a, thereby completing the transistor structures 20a, 20b to become NMOS transistors. The resist mask is removed by an asking treatment or the like.

Next, a resist mask (not shown) covering the N active area and having an aperture capable of exposing the P active area is formed.

Then, using the resist mask and the cap film 15 as a mask, a P type impurity, here B is ion-implanted into the P active area, for example, under such conditions as a dose amount of $1.0 \times 10^{13}/cm^2$ and an acceleration energy of 15 keV to form a so-called LDD area 16b.

Next, for example, a silicon oxide film is deposited by a CVD method on the whole surface, and the silicon oxide film is subjected to so-called etch back to form a sidewall insulating film 17 while leaving the silicon oxide film only on the side faces of the gate electrode 14 and the cap film 15 in the P active area.

Next, using the resist mask, the cap film 15 and the sidewall insulating film 17 as a mask, a P type impurity, here B is ion-implanted into the P active area under such conditions as giving a higher impurity concentration than the LDD area 16b, for example, a dose amount of $2.0 \times 10^{13}/cm^2$ and an acceleration energy of 5 keV to form a source/drain area 18a to be overlapped to the LDD area 16a, thereby completing the transistor structures 20c, 20d to become PMOS transistors. The resist mask is removed by an asking treatment or the like.

Figure 1B:
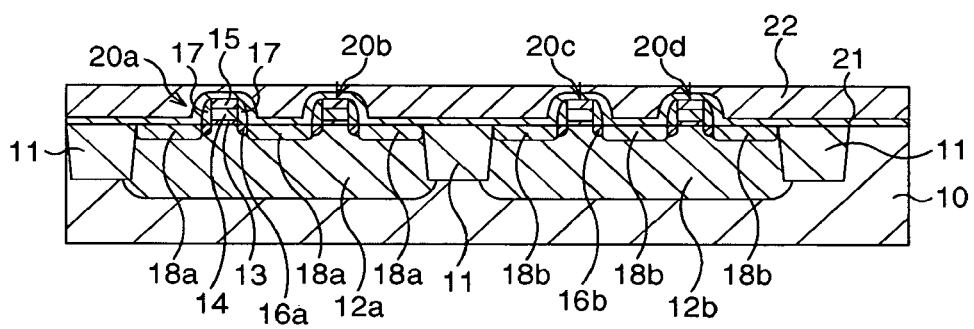

Subsequently, as shown in FIG. 1B, a protective film 21 and an insulating film 22 of the transistor structures 20a, 20b, 20c, 20d are formed.

More specifically, so as to cover the transistor structures 20a, 20b, 20c, 20d, the protective film 21 and the insulating film 22 are deposited sequentially. Here, as the protective film 21, a silicon oxide film is used as a material to be deposited in a thickness of around 20 nm by a CVD method. As the insulating film 22, a laminated structure prepared, for example, by sequentially film-forming a plasma SiO film (thickness of around 20 nm), a plasma SiN film (thickness of around 80 nm) and a plasma TEOS film (thickness of around 1000 nm) is formed and, after the lamination, it is polished till the thickness becomes around 700 nm by chemical mechanical polishing (CMP).

Figure 1C:
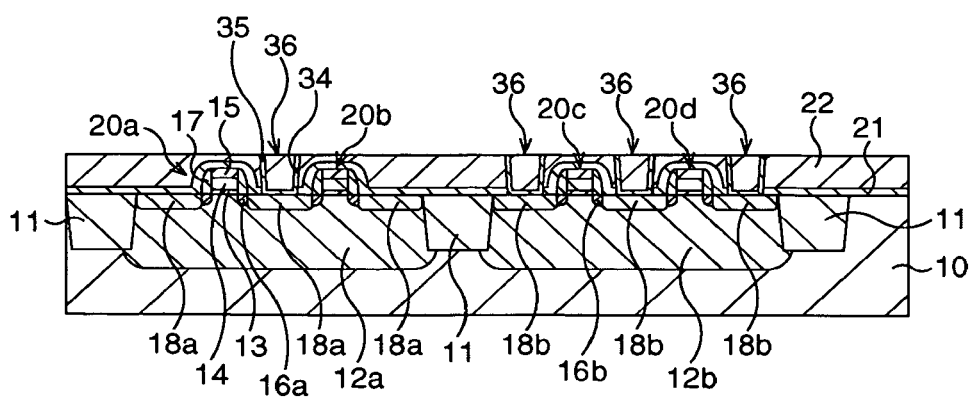

Subsequently, as shown in FIG. 1C, respective plugs 36 to be connected with the source/drain areas 18a, 18b (as to source/drain area 18a, either one thereof) of the transistor structures 20a, 20b, 20c, 20d are formed.

Firstly, respective via holes 34 to the transistor structures 20a, 20b, 20c, 20d are formed.

More specifically, the insulating film 22 and the protective film 21 are processed by lithography and subsequent dry etching to form the via hole 34 capable of exposing either of the source/drain areas 18a, and a part of the surface of the source/drain area 18b respectively.

Next, so as to cover respective wall faces of the via hole 34, for example, a TiN film is deposited in a thickness of around 75 nm by a sputtering method to form a base film (glue film) 35. Then, so as to embed the via hole 34 via the glue film 35, a single film or a laminated film of W, TiAlN, TiN, Ti, Al, Cu, Ru, SRO or Ir, here a W film is formed by a CVD method. After that, the W film and the glue film 35 are polished by CMP using the insulating film 21 as a stopper to form a plug 36 embedding the inside of the via hole 34 with W via the glue film 35.

Figure 2A:
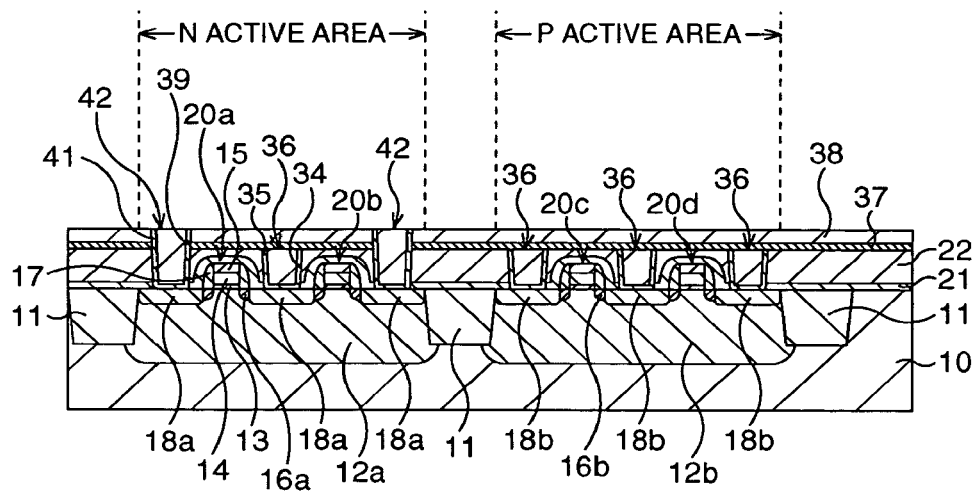
FIGS. 2A to 2C are general cross-sectional views, subsequent to the FIGS. 1A to 1C, showing the constitution of the stack type FeRAM according to the first embodiment along with its manufacturing method according to the order of the steps.

Subsequently, as shown in FIG. 2A, after forming an anti-oxidizing film 37 and a plasma TEOS film 38, respective plugs 42 to be connected with the other of the source/drain area 18a of the transistor structures 20a, 20b are formed.

More specifically, firstly, the anti-oxidizing film 37 of the plug 36 is formed, for example, using SiON as a material in a thickness of around 130 nm by a CVD method or the like.

Next, by a plasma CVD method, the plasma TEOS film 38 having a thickness of around 200 nm is formed.

Next, the plasma TEOS film 38, the anti-oxidizing film 37, the insulating film 22 and the protective film 21 are processed by lithography and subsequent dry etching to form the via holes 39 capable of exposing a part of the other surface of the source/drain area 18a respectively.

Next, so as to cover respective wall faces of the via hole 39, for example, a TiN film is deposited in a thickness of around 75 nm by a sputtering method to form a base film (glue film) 41. Then, so as to embed the via hole 39 via the glue film 41, a single film or a laminated film of W, TiAlN, TiN, Ti, Al, Cu, Ru, SRO or Ir, here a W film is formed by a CVD method. After that, the W film and the glue film 41 are polished by CMP using the plasma TEOS film 38 as a stopper to form a plug 42 embedding the inside of the via hole 39 with W via the glue film 41.

Figure 2B:
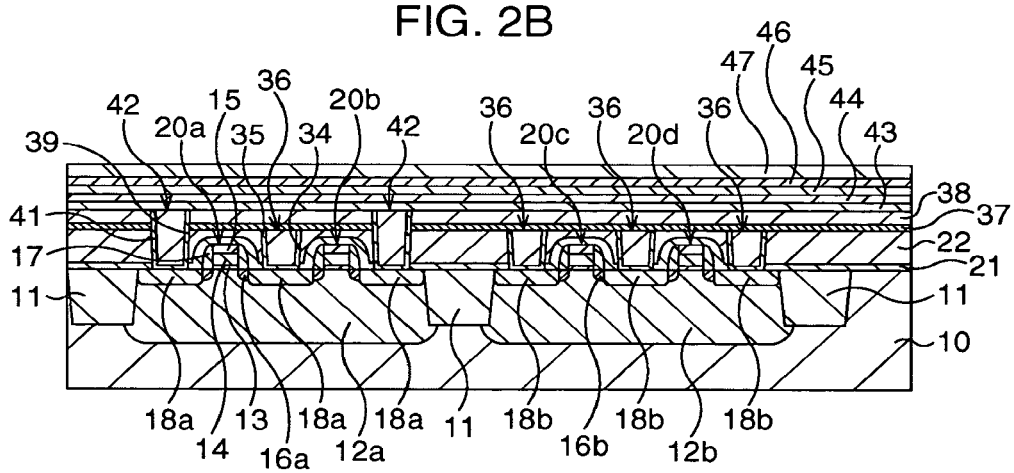

Subsequently, as shown in FIG. 2B, a protective base film 43, a lower electrode layer 44, a ferroelectric film 45, a lower layer upper electrode layer 46 and an upper layer upper electrode layer 47 for forming an after-mentioned ferroelectric capacitor structure 30 is formed respectively.

More specifically, firstly, in order to suppress both of abnormal oxidation of the plug 42 caused by an after-mentioned oxygen annealing treatment of the ferroelectric film 45 and influence of hydrogen taken in the plug 42 upon forming the plug 42 on the ferroelectric film 45, the protective base film 43 being a conductive film is formed in a thickness of around 100 nm, for example, by a sputtering method. As a material of the protective base film 43, a single layer of TiAlN, a laminated structure of TiN and TiAlN or the like, here a laminated structure of TiN and TiAlN is selected.

Next, by a sputtering method, Ir as an example is deposited in a thickness of around 100 nm to form the lower electrode layer 44.

Next, by an MOCVD method, the ferroelectric film 45 composed of, for example, PZT being a ferroelectric substance is deposited on the lower electrode layer 44 in a thickness of around 100 nm at around 450° C.-650° C., here at 550° C. On this occasion, when the ferroelectric film 45 is in an amorphous state in the initial phase of film formation, the ferroelectric film 45 is subjected to an RTA treatment to crystallize. When the ferroelectric substance 45 has already crystallized, an RTA treatment is not necessarily required.

Next, by a reactive sputtering method, for example, $IrO_2$ being a conductive oxide is deposited on the ferroelectric film 45 in a thickness of around 100 nm to form the lower layer upper electrode layer 46.

Then, by a sputtering method, for example, Ir is deposited on the lower layer upper electrode layer 46 in a thickness of around 100 nm to form the upper electrode layer 47.

In this connection, as a material of the lower electrode layer 44, the ferroelectric film 45, the lower layer upper electrode layer 46 and the upper layer upper electrode layer 47, including the above-described case, at least one selected from Ir, IrOx (typically x=2), Pt, SRO, LNO, LSCO, Ru, $RuO_2$, $SrRuO_3$ and the like is used respectively.

Figure 2C:
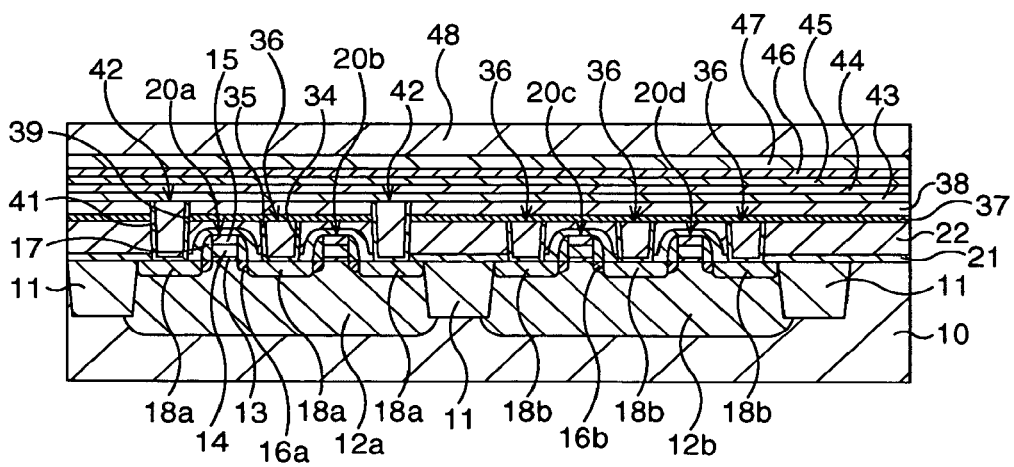

Subsequently, as shown in FIG. 2C, a hard mask material 48 is formed.

More specifically, on the upper layer upper electrode layer 47, for example, a TEOS film is deposited in a thickness of around 600 nm by a CVD method or the like to form the hard mask material 48.

Figure 3A:
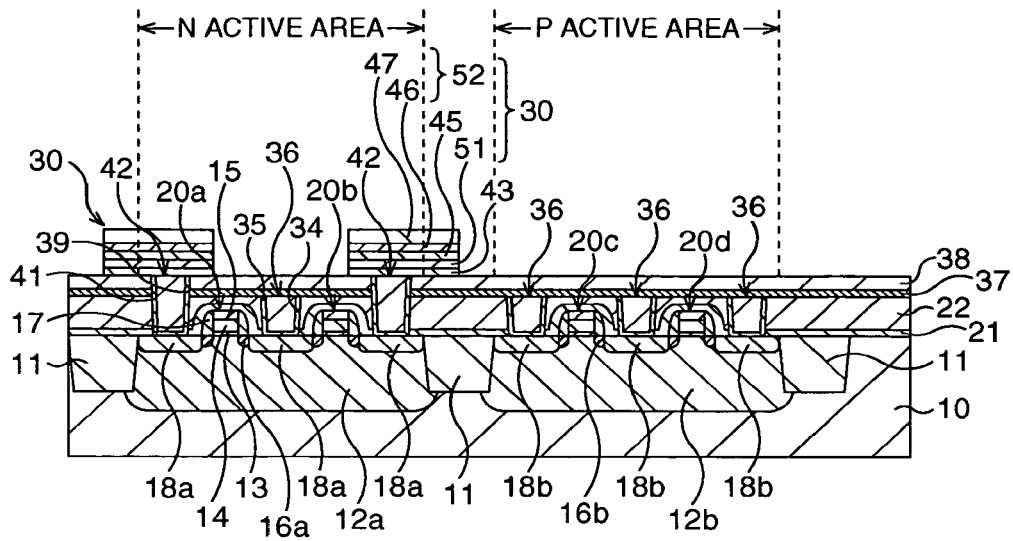
FIGS. 3A to 3C are general cross-sectional views, subsequent to the FIGS. 2A to 2C, showing the constitution of the stack type FeRAM according to the first embodiment along with its manufacturing method according to the order of the steps.

Subsequently, as shown in FIG. 3A, the ferroelectric capacitor structure 30 of a lower layer is formed.

More specifically, using the hard mask material 48, the upper layer upper electrode layer 47, the lower layer upper electrode layer 46, the ferroelectric film 45, the lower electrode layer 44 and the protective base film 43 are etched altogether, for example, at 400° C. Then, by removing the hard mask material 48 by wet etching or the like, the ferroelectric capacitor structure 30 is completed in the N active area via the plug 42 and the protective base film 43, the structure being constituted by sandwiching the ferroelectric film 45 with a lower electrode 51 composed of the lower electrode layer 44, and an upper electrode 52 being a laminated structure of the lower layer upper electrode layer 46 and the upper layer upper electrode layer 47.

Figure 3B:
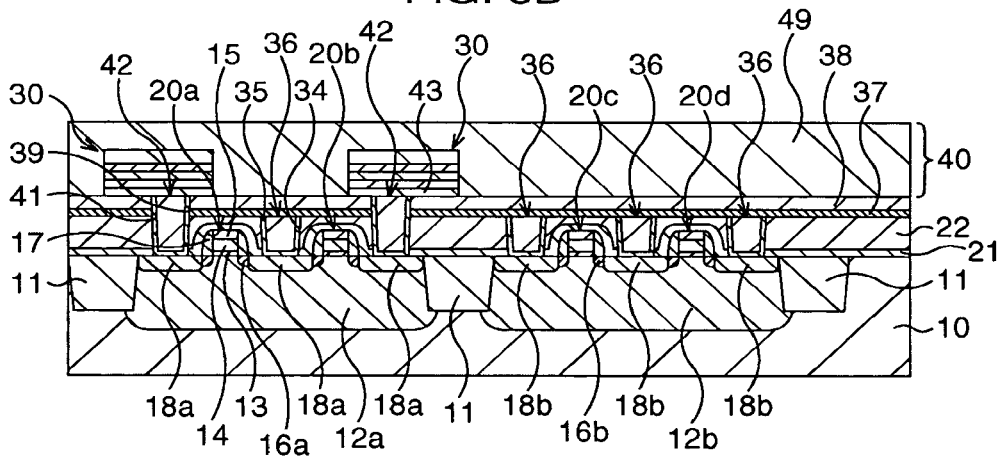

Subsequently, as shown in FIG. 3B, a first interlayer insulating film 49 covering the ferroelectric capacitor structure 30 is formed.

More specifically, for example, by a high density plasma (HDP) CVD method, a silicon oxide film is deposited in a thickness of around 1300 nm so as to cover the ferroelectric capacitor structure 30, followed by flattening the surface of the silicon oxide film by CMP to form the first interlayer insulating film 49. In the first interlayer insulating film 49, plural (2 in the illustrated example) ferroelectric capacitor structures 30 are encapsulated. On this occasion, a lower layer capacitor layer 40 is constituted by the ferroelectric capacitor structure 30 and the first interlayer insulating film 49.

Figure 3C:
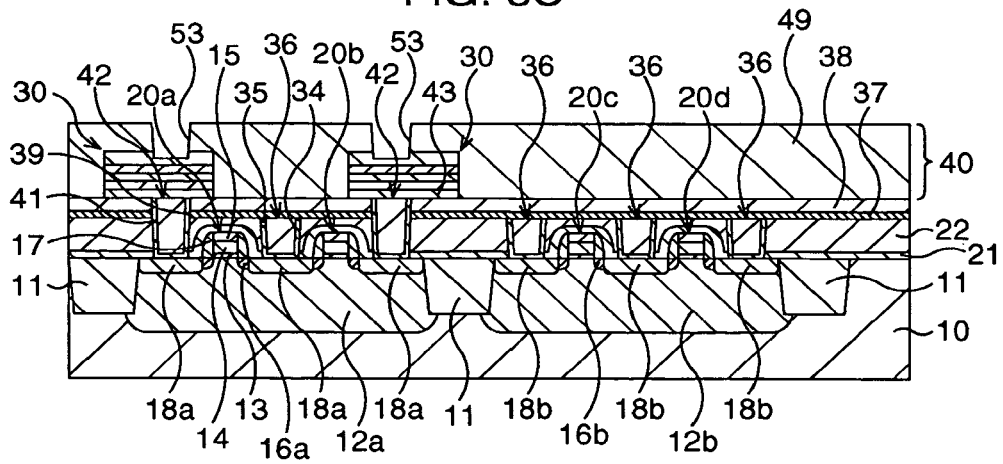

Subsequently, as shown in FIG. 3C, a via hole 53 is formed.

More specifically, by lithography and dry etching, the first interlayer insulating film 49 is patterned at a site matching with the upside of the upper electrode 52 of the ferroelectric capacitor structure 30 to form the via hole 53 capable of exposing a part of the surface of the upper electrode 52.

After that, in order to recover damage given at etching of the ferroelectric capacitor structure 30, an oxygen annealing treatment is carried out. Here, for example, an annealing treatment at a treatment temperature of 500° C. in oxygen atmosphere for 60 minutes is carried out. In the present embodiment, since the protective base film 43 is disposed between the ferroelectric capacitor structure 30 and the plug 42, abnormal oxidation of the plug 42 is prevented even when the oxygen annealing treatment is carried out. Together with that, generation of hydrogen taken in the plug 42 upon forming the plug 42 is suppressed by the protective base film 43.

Figure 4A:
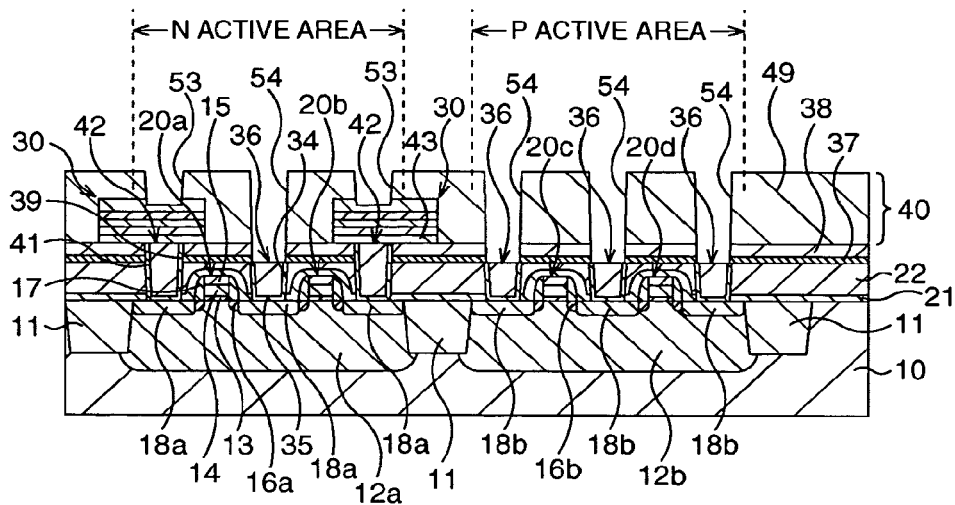
FIGS. 4A to 4C are general cross-sectional views, subsequent to the FIGS. 3A to 3C, showing the constitution of the stack type FeRAM according to the first embodiment along with its manufacturing method according to the order of the steps.

Subsequently, as shown in FIG. 4A, a via hole 54 is formed.

More specifically, by lithography and dry etching, the first interlayer insulating film 49, the plasma TEOS film 38 and the anti-oxidizing film 37 are patterned at a site matching with the upside of the plug 36 to form a via hole 54 capable of exposing at least a part of the surface of the plug 36.

Figure 4B:
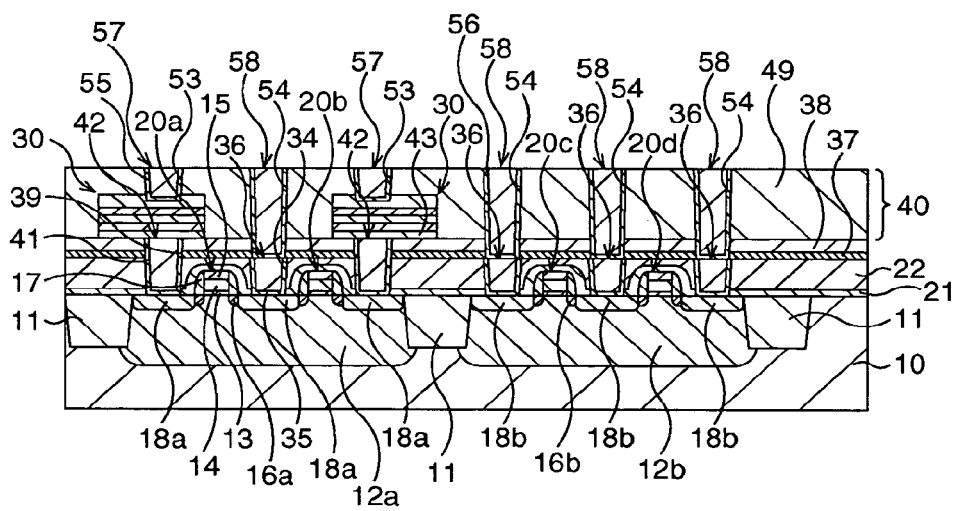

Subsequently, as shown in FIG. 4B, respective plugs 57 to be connected with the upper electrode 52 of the ferroelectric capacitor structure 30 and respective plugs 58 to be connected with the plugs 36 are formed.

More specifically, so as to cover respective wall faces of the via holes 53, 54, for example, a TiN film is deposited in a thickness of around 75 nm by a sputtering method to form the base films (glue film) 55, 56. Then, so as to embed the via holes 53, 54 via the glue films 55, 56, a single film or a laminated film of W, TiAlN, TiN, Ti, Al, Cu, Ru, SRO or Ir, here a W film is formed by a CVD method. After that, the W film and the glue films 55, 56 are polished by CMP using the first interlayer insulating film 49 as a stopper to form the plugs 57, 58 embedding the inside of the via holes 53, 54 with W via the glue films 55, 56 respectively.

Figure 4C:
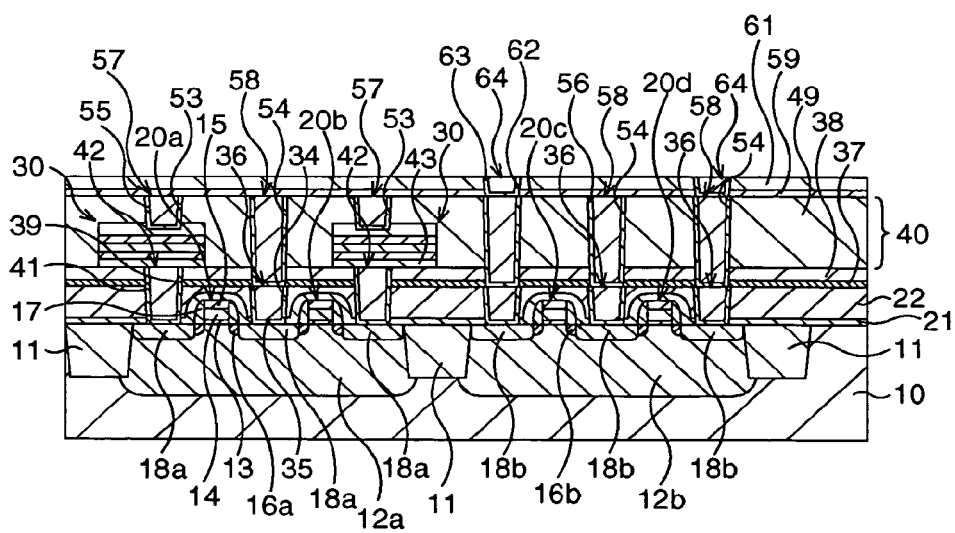

Subsequently, as shown in FIG. 4C, after forming an anti-oxidizing film 59 and a plasma TEOS film 61, respective plugs 64 to be connected with a part of the plugs 58 are formed.

More specifically, firstly, an anti-oxidizing film 59 of the plugs 57, 58 is formed in a thickness of around 130 nm, for example, using SiON as a material by a CVD method or the like.

Next, by a plasma CVD method, the plasma TEOS film 61 having a thickness of around 200 nm is formed.

Next, the plasma TEOS film 59 and the anti-oxidizing film 61 are processed by lithography and subsequent dry etching to form a via hole 62 capable of exposing the surface of a part of the plugs 58 respectively.

Next, so as to cover respective wall faces of the via hole 62, for example, a TiN film is deposited in a thickness of around 75 nm by a sputtering method to form a base film (glue film) 63. Then, so as to embed the via hole 62 via the glue film 63, a single film or a laminated film of W, TiAlN, TiN, Ti, Al, Cu, Ru, SRO or Ir, here a W film is formed by a CVD method. After that, the W film and the glue film 63 are polished by CMP using the plasma TEOS film 61 as a stopper to form the plug 64 embedding the inside of the via hole 62 with W via the glue film 63.

Figure 5A:
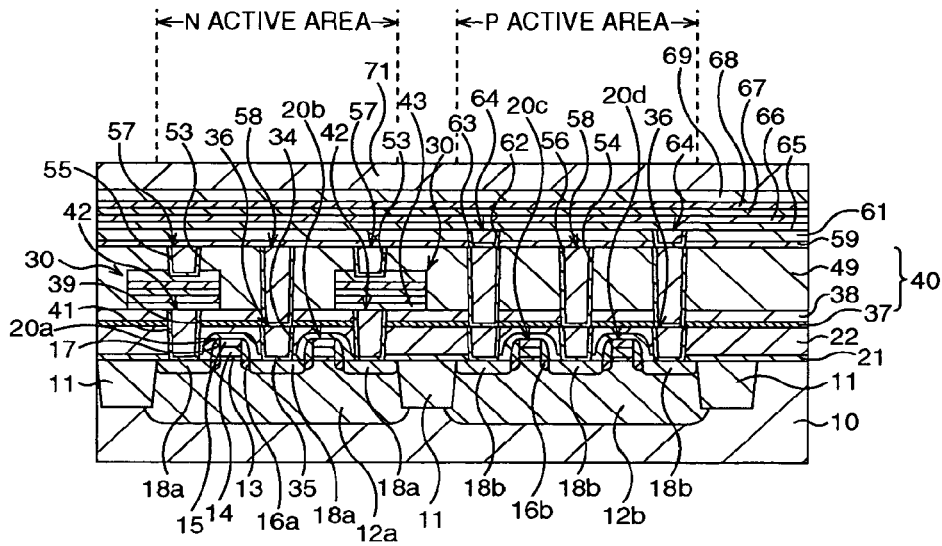
FIGS. 5A to 5C are general cross-sectional views, subsequent to the FIGS. 4A to 4C, showing the constitution of the stack type FeRAM according to the first embodiment along with its manufacturing method according to the order of the steps.

Subsequently, as shown in FIG. 5A, after forming a protective base film 65, a lower electrode layer 66, a ferroelectric film 67 respectively, a lower layer upper electrode layer 68 and an upper layer upper electrode layer 69 for forming an after-mentioned ferroelectric capacitor structure 50, a hard mask material 71 is formed.

More specifically, firstly, in order to suppress both of abnormal oxidation of the plug 64 caused by an after-mentioned oxygen annealing treatment of the ferroelectric film 67 and influence of hydrogen taken in the plug 64 upon forming the plug 64 on the ferroelectric film 67, the protective base film 65 being a conductive film is formed in a thickness of around 100 nm, for example, by a sputtering method. As a material of the protective base film 65, a single layer of TiAlN, a laminated structure of TiN and TiAlN or the like, here a laminated structure of TiN and TiAlN is selected.

Next, by a sputtering method, Ir as an example is deposited in a thickness of around 100 nm to form the lower electrode layer 66.

Next, by an MOCVD method, the ferroelectric film 67 composed of, for example, PZT being a ferroelectric substance is deposited on the lower electrode layer 66 in a thickness of around 100 nm at around 450° C.-650° C., here at 550° C. On this occasion, when the ferroelectric film 67 is in an amorphous state in the initial phase of film formation, the ferroelectric film 67 is subjected to an RTA treatment to crystallize. When the ferroelectric substance 67 has already crystallized, an RTA treatment is not necessarily required.

Next, by a reactive sputtering method, for example, $IrO_2$ being a conductive oxide is deposited on the ferroelectric film 67 in a thickness of around 100 nm to form the lower layer upper electrode layer 68.

Then, by a sputtering method, for example, Ir is deposited on the lower layer upper electrode layer 68 in a thickness of around 100 nm to form the upper electrode layer 69.

In this connection, as a material of the lower electrode layer 66, the ferroelectric film 67, the lower layer upper electrode layer 68 and the upper layer upper electrode layer 69, including the above-described case, at least one selected from Ir, IrOx (typically x=2), Pt, SRO, LNO, LSCO, Ru, $RuO_2$, $SrRuO_3$ and the like is used respectively.

Next, on the upper layer upper electrode layer 69, for example, a TEOS film is deposited in a thickness of around 600 nm by a CVD method or the like to form a hard mask material 71.

Figure 5B:
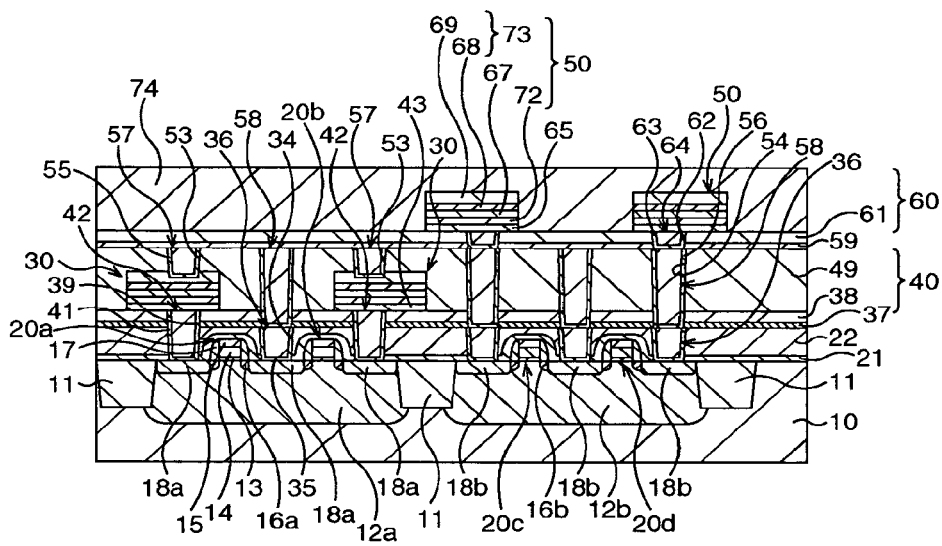

Subsequently, as shown in FIG. 5B, after forming the ferroelectric capacitor structure 50 of an upper layer, a second interlayer insulating film 74 covering the ferroelectric capacitor structure 50 is formed.

More specifically, using the hard mask material 71, the upper layer upper electrode layer 69, the lower layer upper electrode layer 68, the ferroelectric film 67, the lower electrode layer 66 and the protective base film 65 are etched altogether, for example, at 400° C. Then, by removing the hard mask material 71 by wet etching or the like, the ferroelectric capacitor structure 50 is completed in the P active area via the plug 64 and the protective base film 65, the structure being constituted by sandwiching the ferroelectric film 67 with a lower electrode 72 composed of the lower electrode layer 66, and an upper electrode 73 being a laminated structure of the lower layer upper electrode layer 68 and the upper layer upper electrode layer 69.

Next, for example, by a high density plasma (HDP) CVD method, a silicon oxide film is deposited in a thickness of around 1300 nm so as to cover the ferroelectric capacitor structure 50, followed by flattening the surface of the silicon oxide film by CMP to form the second interlayer insulating film 74. In the second interlayer insulating film 74, plural (2 in the illustrated example) ferroelectric capacitor structures 50 are encapsulated. On this occasion, an upper layer capacitor layer 60 lying above the lower layer capacitor layer 40 is constituted by the ferroelectric capacitor structure 50 and the second interlayer insulating film 74.

Figure 5C:
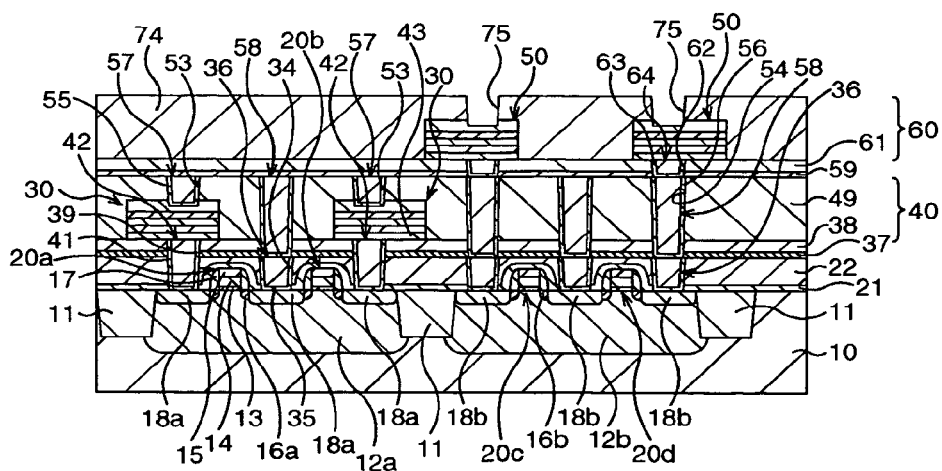

Subsequently, as shown in FIG. 5C, a via hole 75 is formed.

More specifically, by lithography and dry etching, the second interlayer insulating film 74 is patterned at a site matching with the upside of the upper electrode 73 of the ferroelectric capacitor structure 50 to form the via hole 75 capable of exposing a part of the surface of the upper electrode 73.

After that, in order to recover damage given at etching of the ferroelectric capacitor structure 50, an oxygen annealing treatment is carried out. Here, for example, an annealing treatment at a treatment temperature of 500° C. in oxygen atmosphere for 60 minutes is carried out. In the present embodiment, since the protective base film 65 is disposed between the ferroelectric capacitor structure 50 and the plug 64, abnormal oxidation of the plug 64 is prevented even when the oxygen annealing treatment is carried out. Together with that, generation of hydrogen taken in the plug 64 upon forming the plug 64 is suppressed by the protective base film 65.

Figure 6A:
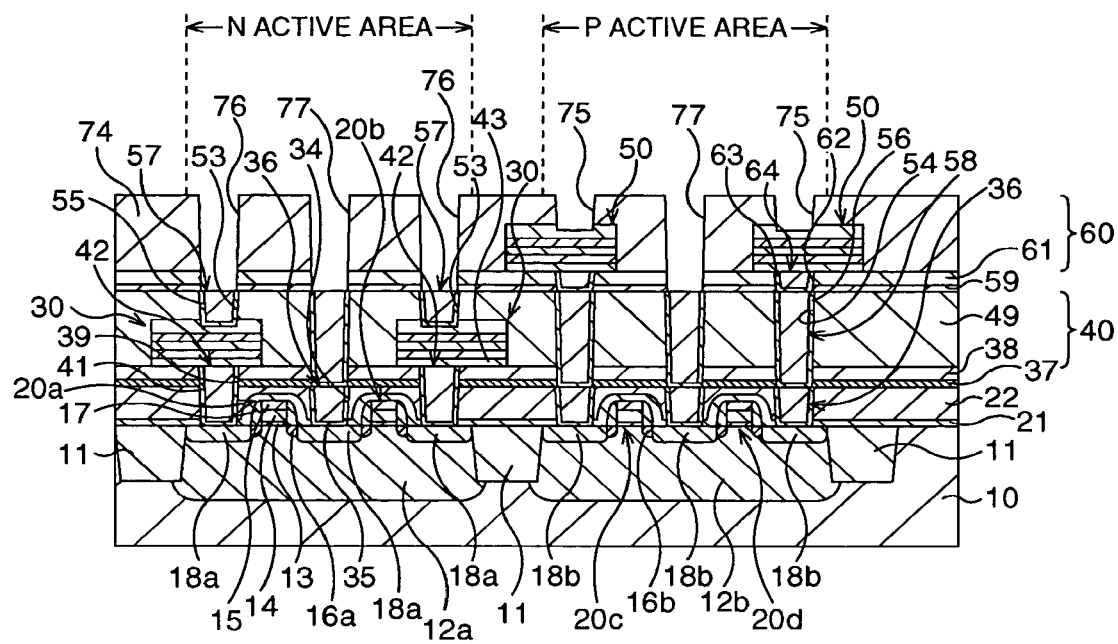
FIGS. 6A to 6B are general cross-sectional views, subsequent to the FIGS. 5A to 5C, showing the constitution of the stack type FeRAM according to the first embodiment along with its manufacturing method according to the order of the steps.

Subsequently, as shown in FIG. 6A, via holes 76, 77 are formed.

More specifically, by lithography and dry etching, the second interlayer insulating film 74, the plasma TEOS film 61 and the anti-oxidizing film 59 are patterned at a site matching with the upside of the plugs 57, 58 to form the via holes 76, 77 capable of exposing at least a part of the surface of plugs 57, 58 respectively.

Figure 6B:
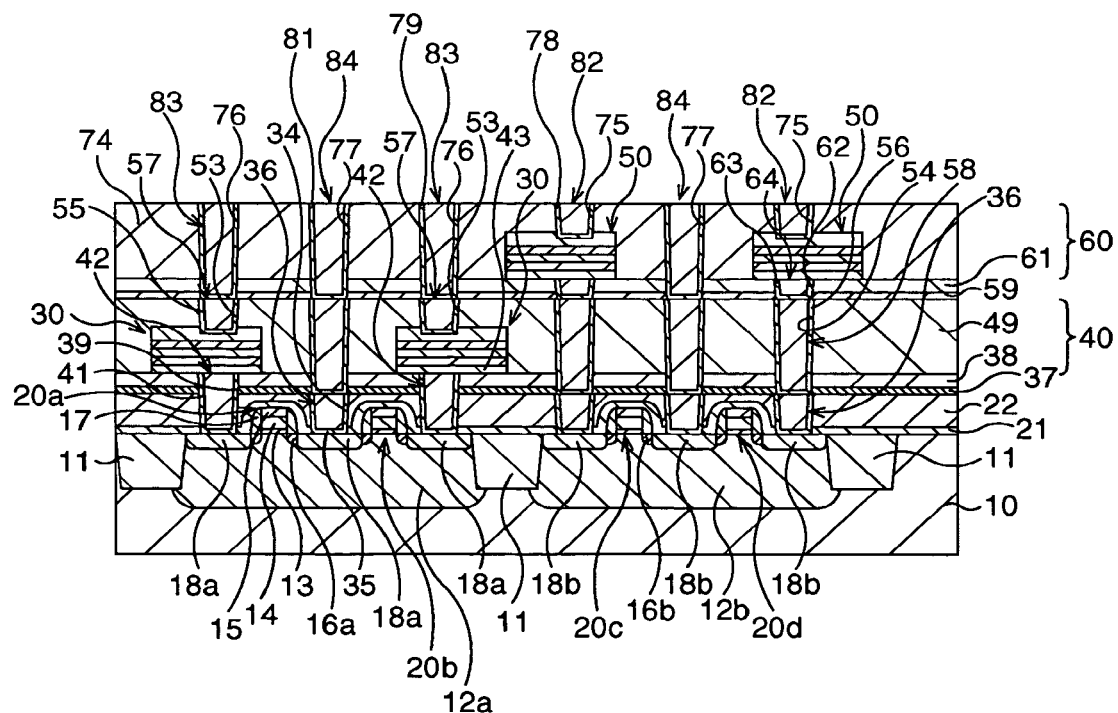

Subsequently, as shown in FIG. 6B, respective plugs 82 to be connected with the upper electrode 73 of the ferroelectric capacitor structure 50, respective plugs 83 to be connected with the plug 57, and respective plugs 84 to be connected with the plug 58 are formed.

More specifically, so as to cover respective wall faces of the via holes 75, 76, 77, for example, a TiN film is deposited in a thickness of around 75 nm by a sputtering method to form base films (glue film) 78, 79, 81. Then, so as to embed the via holes 75, 76, 77 via the glue films 78, 79, 81, a single film or a laminated film of W, TiAlN, TiN, Ti, Al, Cu, Ru, SRO or Ir, here a W film is formed by a CVD method. After that, the W film and the glue films 78, 79, 81 are polished by CMP using the second interlayer insulating film 74 as a stopper to form the plugs 82, 83, 84 embedding the inside of the via holes 75, 76, 77 with W via the glue films 78, 79, 81 respectively.

Figure 7A:
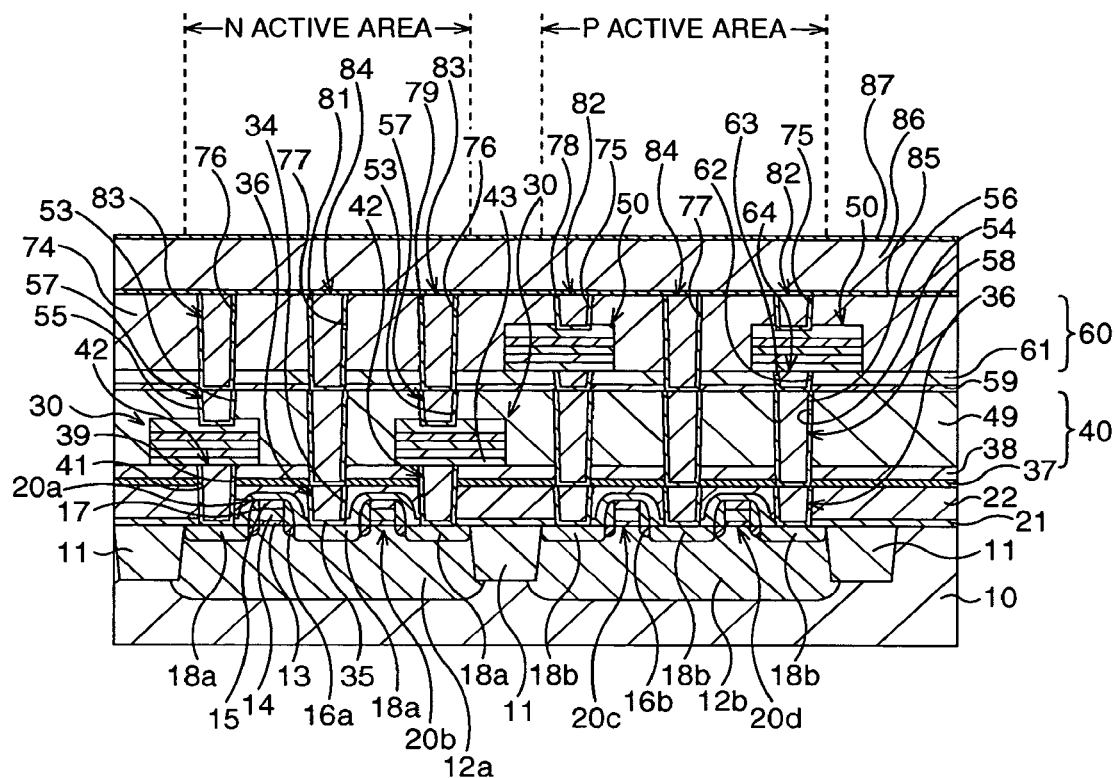
FIGS. 7A to 7B are general cross-sectional views, subsequent to the FIGS. 6A to 6B, showing the constitution of the stack type FeRAM according to the first embodiment along with its manufacturing method according to the order of the steps.

Subsequently, as shown in FIG. 7A, a barrier metal film 85, a wiring layer 86 and a barrier metal film 87 are formed sequentially.

More specifically, firstly by a sputtering method, for example, TiN is deposited in a thickness of around 60 nm to form the barrier metal film 85.

Next, by a sputtering method, for example, an Al—Cu alloy is deposited in a thickness of around 360 nm to form the wiring layer 86.

Next, by a sputtering method, for example, a laminated film of TiN and Ti is deposited in a thickness of around 70 nm to form the barrier metal film 87.

Figure 7B:
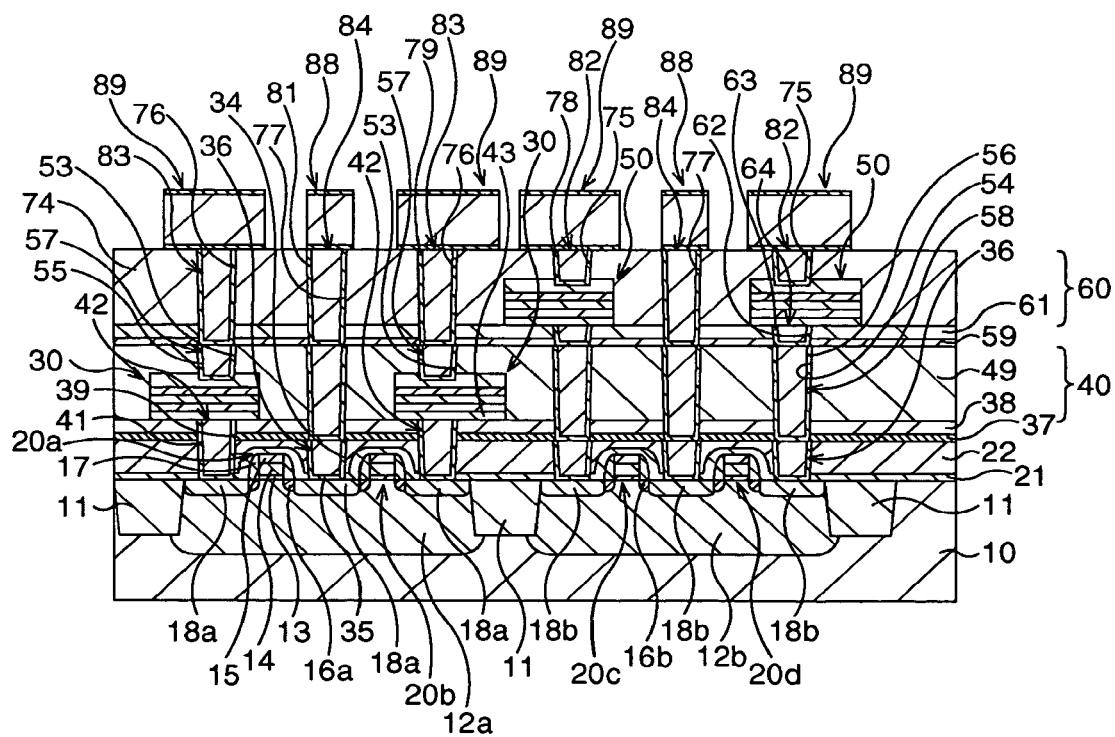

Subsequently, as shown in FIG. 7B, a bit wire 88 to be connected with the plug 84, and a plate wire 89 to be connected with the plugs 82, 83 are formed respectively.

More specifically, the barrier metal film 87, the wiring layer 86 and the barrier metal film 85 are patterned by lithography and dry etching. By the patterning, respective bit wires 88 to be connected with the plug 84, and respective plate wires 89 to be connected with the plugs 82, 83 are formed.

After that, through the formation of an interlayer insulating film, an upper layer wiring, a protective insulating film and the like, the stack type FeRAM according to the present embodiment is completed. In the illustrated example, respective memory cells of the 1T1C structure are constituted by the transistor structure 20a or 20b and the ferroelectric capacitor structure 30, and the transistor structure 20c or 20d and the ferroelectric capacitor structure 50.

Description will be given about the size of the ferroelectric capacitor structure of the stack type FeRAM according to the present embodiment formed as an above-described manner on the basis of the comparison with a stack type FeRAM of single layer structure according to a conventional method.

Figure 19A:
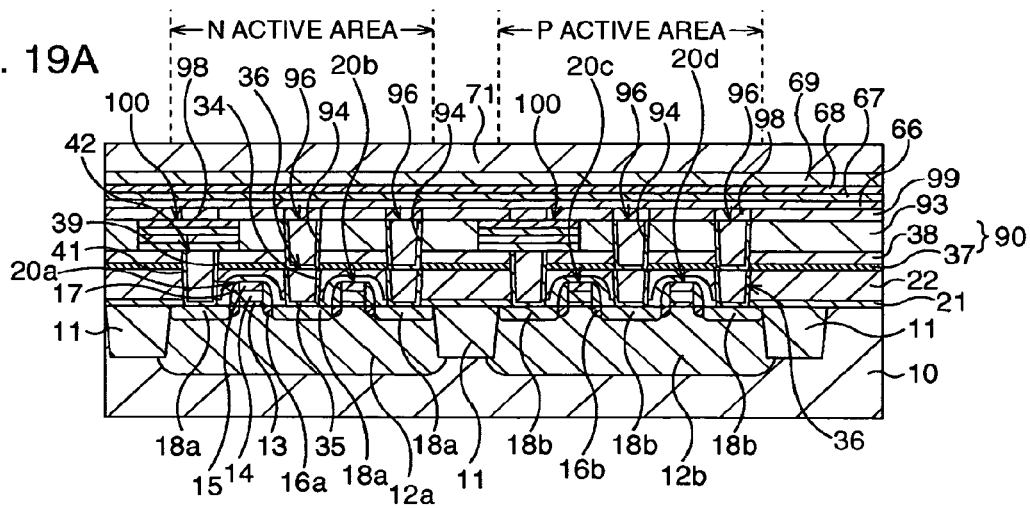
FIGS. 19A to 19C are general cross-sectional views, subsequent to FIGS. 18A to 18C, showing the constitution of the stack type FeRAM according to the modified example 3 of the first embodiment along with its manufacturing method according to the order of the steps.
Figure 19B:
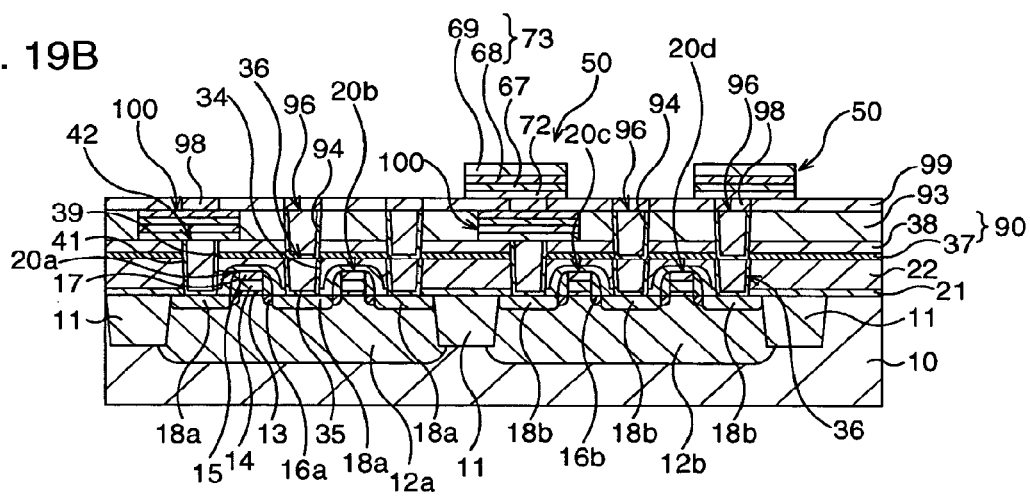
Figure 19C:
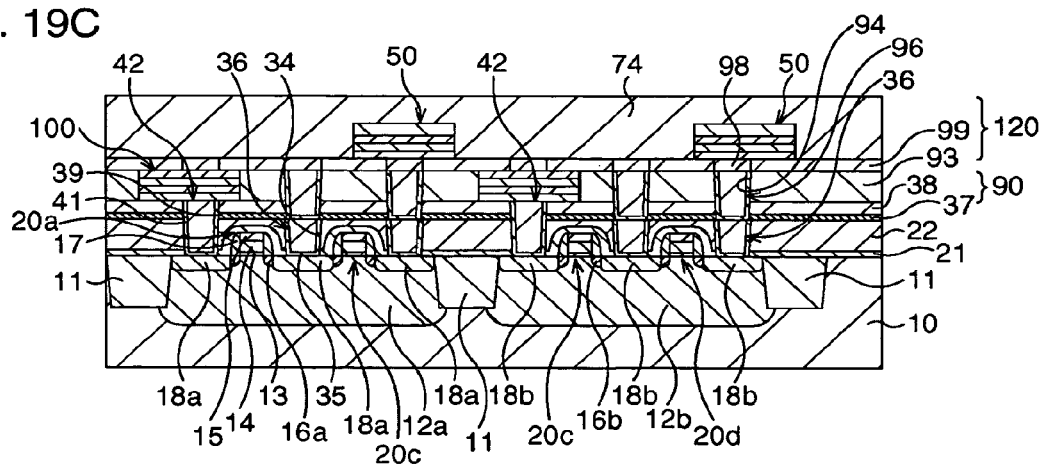

FIGS. 8A to 8B are general plan view showing a layout in the vicinity of the ferroelectric capacitor structure of a FeRAM, wherein FIG. 8A shows the FeRAM of 2-layered structure according to the first embodiment (for example, the portion of lower layer capacitor layer 40 in FIGS. 19A to 19C), and FIG. 8B shows an FeRAM of a single layer structure according to a conventional method, respectively. For the sake of simplicity of illustration, in FIG. 8B, respective constructional elements corresponding to those in FIG. 8A are given the same symbols.

Table 1 shows respective clearances and the like in the vicinity of the ferroelectric capacitor structure.

TABLE 1

| | Present Invention | Conventional Type |
|---|---|---|
| Unit Cell Area | $1 \times 1.48 = 1.48 \: \mu m^2$ | $1 \times 1.2 = 1.2 \: \mu m^2$ |
| Upper Electrode Area | $0.7 \times 0.98 = 0.686 \: \mu m^2$ | $0.7 \times 0.7 = 0.49 \: \mu m^2$ |
| Margin to Adjacent Cell | H 0.13 μm, W 0.12 μm | H 0.13 μm, W 0.12 μm |
| Plug 42-Gate Distance | 0.17 μm | 0.17 μm |
| Plug 36-Gate Distance | 0.13 μm | 0.13 μm |
| Plug 36-Upper | 0.255 μm | 0.255 μm |

TABLE 1-continued

| | Present Invention | Conventional Type |
|---|---|---|
| Electrode Distance | | |

For an FeRAM of single layer structure according to a conventional method, the occupying area of ferroelectric capacitor structure 30 is 0.49 μm². On the contrary, for the FeRAM of 2-layered structure according to the present embodiment, the occupying area of ferroelectric capacitor structure 30 becomes 0.686 μm² while maintaining the same interplug distance as that of a conventional FeRAM. Consequently, in the present embodiment, it is possible to enlarge the occupying area of the ferroelectric capacitor structure 30 by around 40% compared with the conventional example. When assuming the same charge quantity per unit area for the present embodiment and the conventional example, it is possible to increase charge quantity per one memory cell by around 40% to make further miniaturization of an FeRAM possible.

Incidentally, in the present embodiment, the case is exemplified where the lower layer capacitor layer 40 and the upper layer capacitor layer 60 having different heights from the surface of semiconductor substrate 10 respectively are laminated into a 2-layered structure, however the present invention is not restricted to this constitution. For example, a structure having such construction that respective capacitor layers are laminated by three layers or more may be acceptable.

As described above, according to the present embodiment, it becomes possible to realize miniaturization/high integration and increase in quantity of accumulated charges, and to give a stack type FeRAM having a high reliability.

MODIFIED EXAMPLES

Here, various modified examples of the first embodiment will be described. In these modified examples, stack type FeRAMs are disclosed as is the case for the first embodiment. In this connection, for the sake of simplicity of description, constructional elements similar to those described in the first embodiment will be given the same symbols as those in the first embodiment.

Modified Example 1

In the modified example 1, a protective insulating film for suppressing intrusion of hydrogen into the ferroelectric film is formed.

FIGS. 9A to 11B are general cross-sectional views showing the constitution of the stack type FeRAM according to the modified example 1 of the first embodiment along with its manufacturing method according to the order of the steps.

Firstly, as is the case for the first embodiment, the ferroelectric capacitor structure 30 is formed through respective steps of FIGS. 1A to 3A.

Figure 9A:
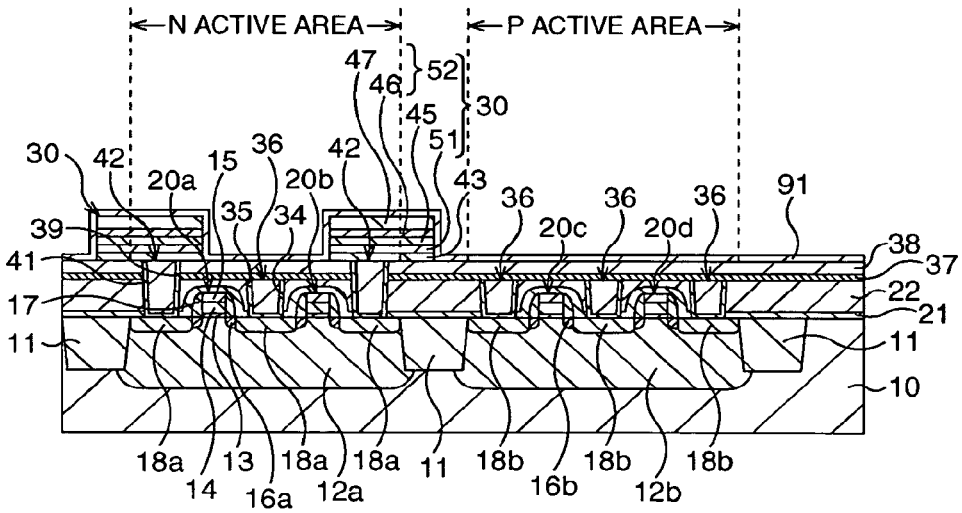
FIGS. 9A to 9C are general cross-sectional views showing the constitution of the stack type FeRAM according to the modified example 1 of the first embodiment along with its manufacturing method according to the order of the steps.

Subsequently, as shown in FIG. 9A, a protective insulating film 91 covering the ferroelectric capacitor structure 30 is formed.

More specifically, so as to cover the ferroelectric capacitor structure 30, a metal oxide film, for example, using alumina as a material is deposited on the plasma TEOS film 38 in a thickness of around 30 nm by a sputtering method to form the protective insulating film 91. By the protective insulating film 91, intrusion of moisture/hydrogen, for example, from a silicon oxide film or the like formed in a later step into the ferroelectric film 45 is suppressed, and damage to the ferroelectric film 45 is prevented.

Figure 9B:
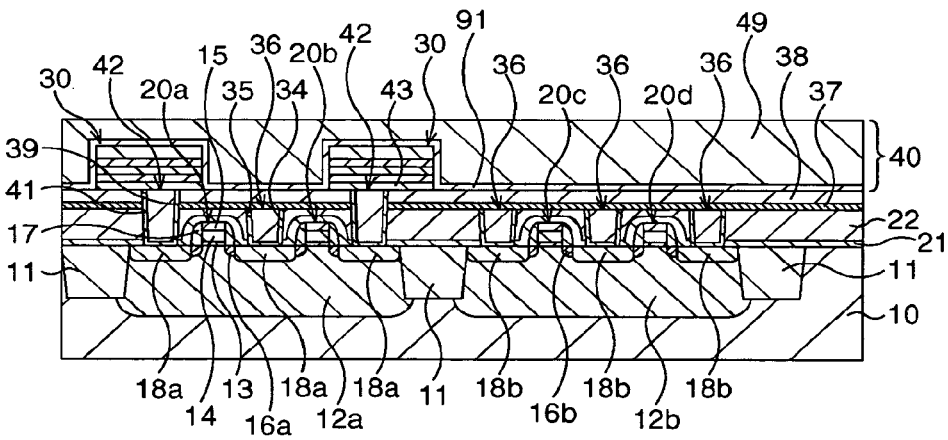

Subsequently, as shown in FIG. 9B, the first interlayer insulating film 49 covering the ferroelectric capacitor structure 30 via the protective insulating film 91 is formed.

More specifically, for example, by a high density plasma (HDP) CVD method, a silicon oxide film is deposited in a thickness of around 1300 nm so as to cover the ferroelectric capacitor structure 30 via the protective insulating film 91, followed by flattening the surface of the silicon oxide film by CMP to form the first interlayer insulating film 49. In the first interlayer insulating film 49, plural (2 in the illustrated example) ferroelectric capacitor structures 30 are encapsulated via the protective insulating film 91. On this occasion, the lower layer capacitor layer 70 is constituted by the ferroelectric capacitor structure 30, the protective insulating film 91 and the first interlayer insulating film 49.

Figure 9C:
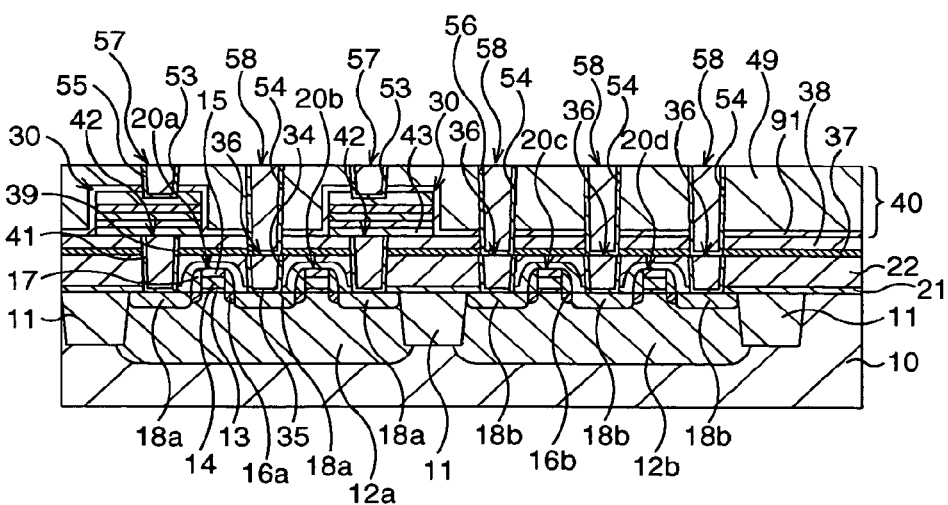

Subsequently, as shown in FIG. 9C, the plugs 57, 58 are formed.

More specifically, firstly, by lithography and dry etching, the first interlayer insulating film 49 is patterned at a site matching with the upside of the upper electrode 52 of the ferroelectric capacitor structure 30 to form the via hole 53 capable of exposing a part of the surface of the upper electrode 52.

After that, in order to recover damage given at etching of the ferroelectric capacitor structure 30, an oxygen annealing treatment is carried out. Here, for example, an annealing treatment at a treatment temperature of 500° C. in oxygen atmosphere for 60 minutes is carried out. In the present embodiment, since the protective base film 43 is disposed between the ferroelectric capacitor structure 30 and the plug 42, abnormal oxidation of the plug 42 is prevented even when the oxygen annealing treatment is carried out. Together with that, generation of hydrogen taken in the plug 42 upon forming the plug 42 is suppressed by the protective base film 43.

Next, by lithography and dry etching, the first interlayer insulating film 49, the protective insulating film 91, the plasma TEOS film 38 and the anti-oxidizing film 37 are patterned at a site matching with the upside of the plug 36 to form a via hole 54 capable of exposing at least a part of the surface of the plug 36.

Next, so as to cover respective wall faces of the via holes 53, 54, for example, a TiN film is deposited in a thickness of around 75 nm by a sputtering method to form the base films (glue film) 55, 56. Then, so as to embed the via holes 53, 54 via the glue films 55, 56, a single film or a laminated film of W, TiAlN, TiN, Ti, Al, Cu, Ru, SRO or Ir, here a W film is formed by a CVD method. After that, the W film and the glue films 55, 56 are polished by CMP using the first interlayer insulating film 49 as a stopper to form the plugs 57, 58 embedding the inside of the via holes 53, 54 with W via the glue films 55, 56 respectively. Respective plugs 57 are connected with the upper electrode 52 of the ferroelectric capacitor structure 30, and respective plugs 58 are connected with the plug 36.

Figure 10A:
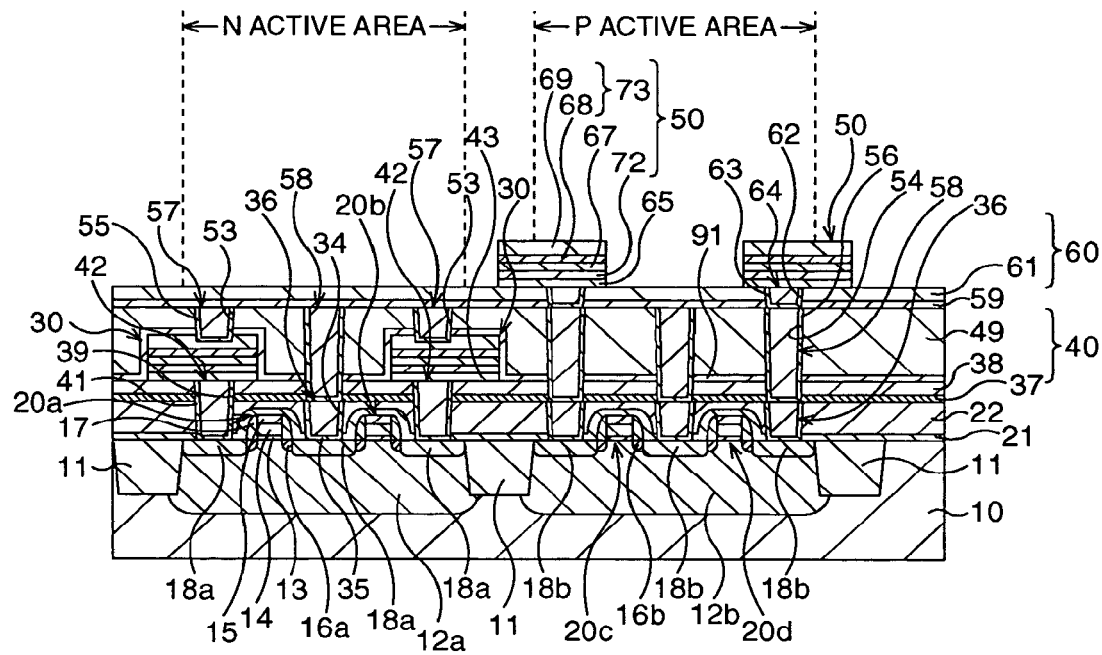
FIGS. 10A to 10B are general cross-sectional views, subsequent to the FIGS. 9A to 9C, showing the constitution of the stack type FeRAM according to the modified example 1 of the first embodiment along with its manufacturing method according to the order of the steps.

Subsequently, as shown in FIG. 10A, respective plugs 64 to be connected with the anti-oxidizing film 59, the plasma TEOS film 61 and a part of the plugs 58, and the ferroelectric capacitor structure 50 are formed sequentially.

More specifically, firstly, the anti-oxidizing film 59 of the plugs 57, 58 is formed in a thickness of around 130 nm, for example, using SiON as a material by a CVD method or the like.

Next, by a plasma CVD method, the plasma TEOS film 61 having a thickness of around 200 nm is formed.

Next, the plasma TEOS film 59 and the anti-oxidizing film 61 are processed by lithography and subsequent dry etching to form the via hole 62 capable of exposing the surface of a part of plugs 58 respectively.

Next, so as to cover respective wall faces of the via hole 62, for example, a TiN film is deposited in a thickness of around 75 nm by a sputtering method to form the base film (glue film) 63. Then, so as to embed the via hole 62 via the glue film 63, a single film or a laminated film of W, TiAlN, TiN, Ti, Al, Cu, Ru, SRO or Ir, here a W film is formed by a CVD method. After that, the W film and the glue film 63 are polished by CMP using the plasma TEOS film 61 as a stopper to form the plug 64 embedding the inside of the via hole 62 with W via the glue film 63.

Next, in order to suppress both of abnormal oxidation of the plug 64 caused by an after-mentioned oxygen annealing treatment of the ferroelectric film 67 and influence of hydrogen taken in the plug 64 upon forming the plug 64 on the ferroelectric film 67, the protective base film 65 being a conductive film is formed in a thickness of around 100 nm, for example, by a sputtering method. As a material of the protective base film 65, a single layer of TiAlN, a laminated structure of TiN and TiAlN or the like, here a laminated structure of TiN and TiAlN is selected.

Next, by a sputtering method, Ir as an example is deposited in a thickness of around 100 nm to form the lower electrode layer 66.

Next, by an MOCVD method, the ferroelectric film 67 composed of, for example, PZT being a ferroelectric substance is deposited on the lower electrode layer 66 in a thickness of around 100 nm at around 450° C.-650° C., here at 550° C. On this occasion, when the ferroelectric film 67 is in an amorphous state in the initial phase of film formation, the ferroelectric film 67 is subjected to an RTA treatment to crystallize. When the ferroelectric substance 67 has already crystallized, an RTA treatment is not necessarily required.

Next, by a reactive sputtering method, for example, $IrO_2$ being a conductive oxide is deposited on the ferroelectric film 67 in a thickness of around 100 nm to form the lower layer upper electrode layer 68.

Then, by a sputtering method, for example, Ir is deposited on the lower layer upper electrode layer 68 in a thickness of around 100 nm to form the upper electrode layer 69.

In this connection, as a material of the lower electrode layer 66, the ferroelectric film 67, the lower layer upper electrode layer 68 and the upper layer upper electrode layer 69, including the above-described case, at least one selected from Ir, IrOx (typically x=2), Pt, SRO, LNO, LSCO, Ru, $RuO_2$, $SrRuO_3$ and the like is used respectively.

Next, on the upper layer upper electrode layer 69, for example, a TEOS film is deposited in a thickness of around 600 nm by a CVD method or the like to form the hard mask material 71.

Next, using the hard mask material 71, the upper layer upper electrode layer 69, the lower layer upper electrode layer 68, the ferroelectric film 67, the lower electrode layer 66 and the protective base film 65 are etched altogether, for example, at 400° C. Then, by removing the hard mask material 71 by wet etching or the like, the ferroelectric capacitor structure 50 is completed in the P active area via the plug 64 and the protective base film 65, the structure being constituted by sandwiching the ferroelectric film 67 with the lower electrode 72 composed of the lower electrode layer 66, and the upper electrode 73 being a laminated structure of the lower layer upper electrode layer 68 and the upper layer upper electrode layer 69.

Figure 10B:
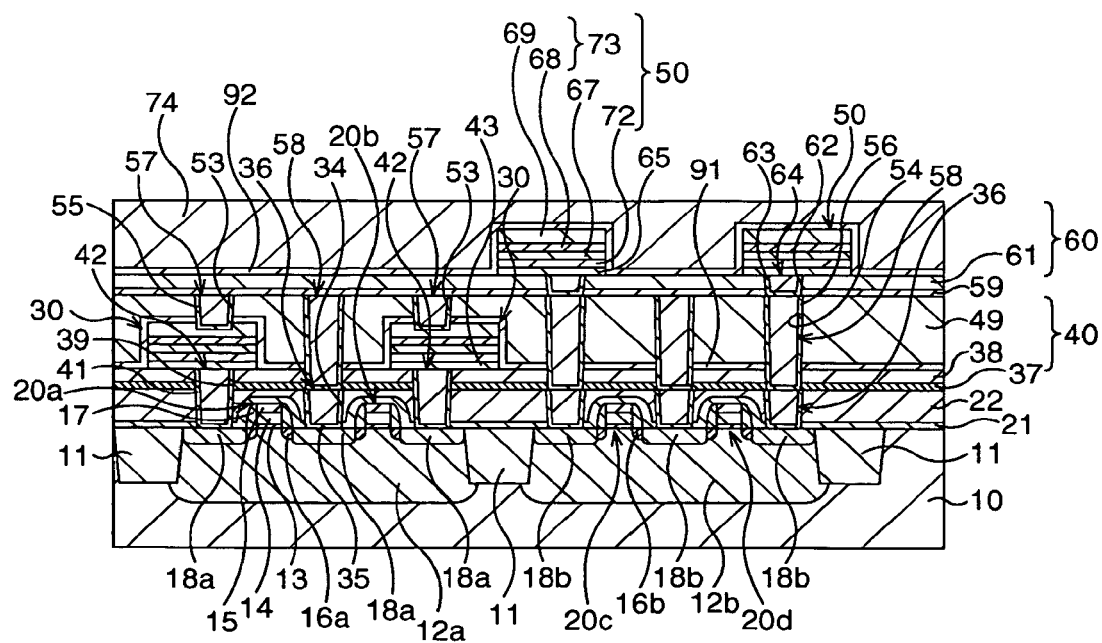

Subsequently, as shown in FIG. 10B, a protective insulating film 92 and the second interlayer insulating film 74 covering the ferroelectric capacitor structure 50 are formed.

More specifically, so as to cover the ferroelectric capacitor structure 50, a metal oxide film, for example, using alumina as a material is deposited on the plasma TEOS film 61 in a thickness of around 30 nm by a sputtering method to form the protective insulating film 92. By the protective insulating film 92, intrusion of moisture/hydrogen, for example, from a silicon oxide film or the like formed in a later step into the ferroelectric film 67 is suppressed, and damage to the ferroelectric film 67 is prevented.

Next, for example, by a high density plasma (HDP) CVD method, a silicon oxide film is deposited in a thickness of around 1300 nm so as to cover the ferroelectric capacitor structure 50, followed by flattening the surface of the silicon oxide film by CMP to form the second interlayer insulating film 74. In the second interlayer insulating film 74, plural (2 in the illustrated example) ferroelectric capacitor structures 50 are encapsulated via the protective insulating film 92. On this occasion, the upper layer capacitor layer 80 lying above the lower layer capacitor layer 70 is constituted by the ferroelectric capacitor structure 50, the protective insulating film 92 and the second interlayer insulating film 74.

Figure 11A:
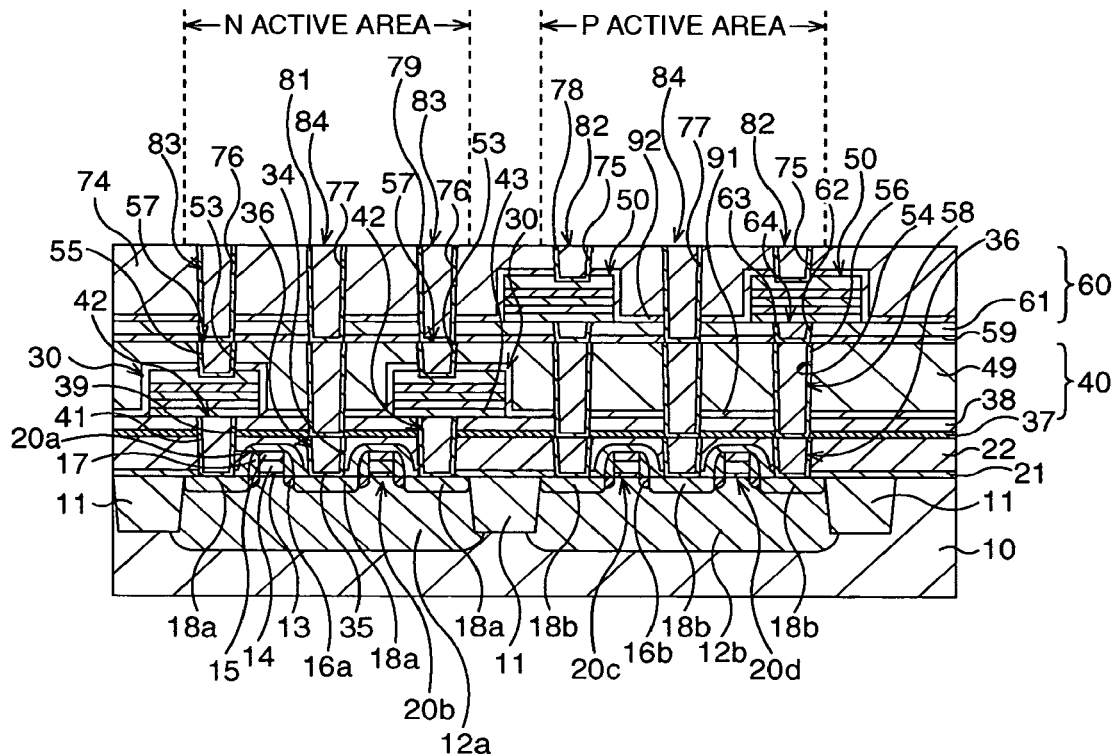
FIGS. 11A to 11B are general cross-sectional views, subsequent to the FIGS. 10A to 10B, showing the constitution of the stack type FeRAM according to the modified example 1 of the first embodiment along with its manufacturing method according to the order of the steps.

Subsequently, as shown in FIG. 11A, respective plugs 82 to be connected with the upper electrode 73 of the ferroelectric capacitor structure 50 and respective plugs 84 to be connected with the plugs 58 are formed.

More specifically, firstly, by lithography and dry etching, the second interlayer insulating film 74 and the protective insulating film 92 are patterned at a site matching with the upside of the upper electrode 73 of the ferroelectric capacitor structure 50 to form the via hole 75 capable of exposing a part of the surface of the upper electrode 73.

After that, in order to recover damage given at etching of the ferroelectric capacitor structure 50, an oxygen annealing treatment is carried out. In the present embodiment, since the protective base film 65 is disposed between the ferroelectric capacitor structure 50 and the plug 64, abnormal oxidation of the plug 64 is prevented even when the oxygen annealing treatment is carried out. Together with that, generation of hydrogen taken in the plug 64 upon forming the plug 64 is suppressed by the protective base film 65.

Next, by lithography and dry etching, the second interlayer insulating film 74, the protective insulating film 92, the plasma TEOS film 61 and the anti-oxidizing film 59 are patterned at a site matching with the upside of the plugs 57, 58 to form the via holes 76, 77 capable of exposing at least a part of the surface of the plugs 57, 58.

Next, so as to cover respective wall faces of the via holes 75, 76, 77, for example, a TiN film is deposited in a thickness of around 75 nm by a sputtering method to form the base films (glue film) 78, 79, 81. Then, so as to embed the via holes 75, 76, 77 via the glue films 78, 79, 81, a single film or a laminated film of W, TiAlN, TiN, Ti, Al, Cu, Ru, SRO or Ir, here a W film is formed by a CVD method. After that, the W film and the glue films 78, 79, 81 are polished by CMP using the second interlayer insulating film 74 as a stopper to form the plugs 82, 83, 84 embedding the inside of the via holes 75, 76, 77 with W via the glue films 78, 79, 81 respectively.

Figure 11B:
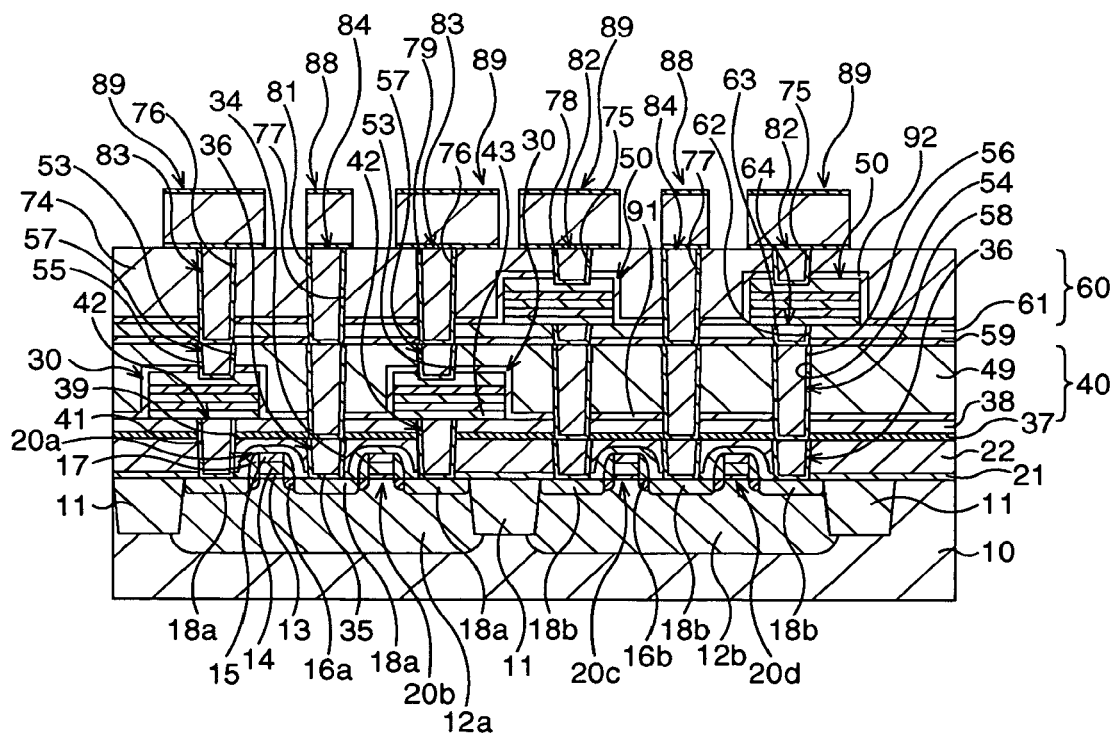

Subsequently, as shown in FIG. 11B, the bit wire 88 to be connected with the plug 84, and the plate wire 89 to be connected with the plugs 82, 83 are formed respectively.

More specifically, firstly, by a sputtering method, for example, TiN is deposited in a thickness of around 60 nm to form the barrier metal film 85.

Next, by a sputtering method, for example, an Al—Cu alloy is deposited in a thickness of around 360 nm to form a wiring layer 86.

Next, by a sputtering method, for example, a laminated film of TiN and Ti is deposited in a thickness of around 70 nm to form the barrier metal film 87.

Next, the barrier metal film 87, the wiring layer 86 and the barrier metal film 85 are patterned by lithography and dry etching. By this pattering, respective bit wires 88 to be connected with the plug 84, and respective plate wires 89 to be connected with the plugs 82, 83 are formed.

After that, through the formation of an interlayer insulating film, an upper layer wiring, a protective insulating film and the like, the stack type FeRAM according to the modified example 1 is completed. In the illustrated example, respective memory cells of the 1T1C structure are constituted by the transistor structure 20a or 20b and the ferroelectric capacitor structure 30, and the transistor structure 20c or 20d and the ferroelectric capacitor structure 50.

As described above, according to the present example, in addition to various advantages exerted by the first embodiment, it becomes possible to suppress inclusion of hydrogen into the ferroelectric films 45, 67 as far as possible, and realize an FeRAM having a high reliability.

Modified Example 2

In the modified example 2, a protective base film for suppressing abnormal oxidation of the plug as well as suppressing incursion of hydrogen into the ferroelectric film is formed.

FIGS. 12A to 15C are general cross-sectional views showing the constitution of the stack type FeRAM according to the modified example 2 of the first embodiment along with its manufacturing method according to the order of the steps.

Firstly, as is the case for the first embodiment, the plugs 36, 42 are formed through respective steps in FIGS. 1A to 2A.

Figure 12A:
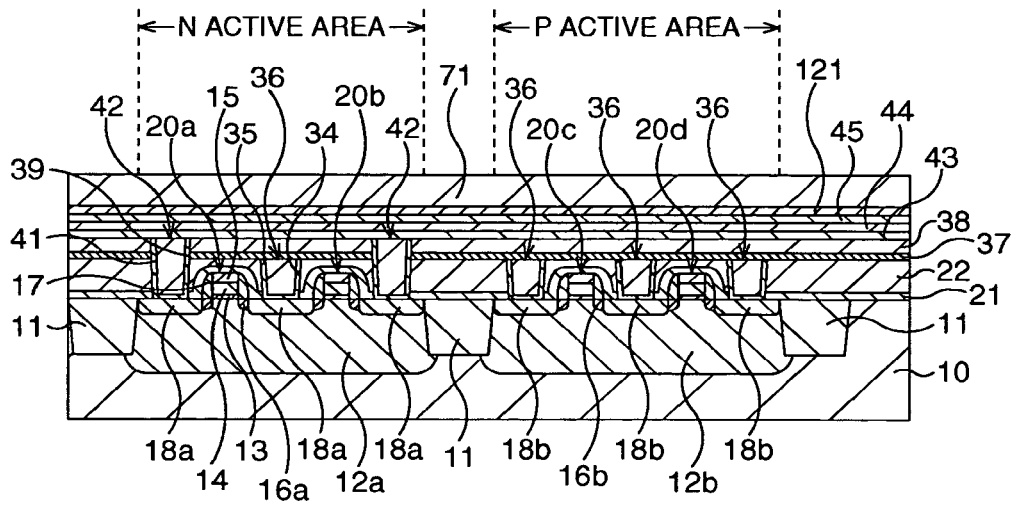
FIGS. 12A to 12C are general cross-sectional views showing the constitution of the stack type FeRAM according to the modified example 2 of the first embodiment along with its manufacturing method according to the order of the steps.

Subsequently, as shown in FIG. 12A, the protective base film 43, the lower electrode layer 44, the ferroelectric film 45 and an upper electrode layer 121 for forming an after-mentioned ferroelectric capacitor structure 100 are formed respectively.

More specifically, firstly, in order to suppress both of abnormal oxidation of the plug 42 caused by an after-mentioned oxygen annealing treatment of the ferroelectric film 45 and influence of hydrogen taken in the plug 42 upon forming the plug 42 on the ferroelectric film 45, the protective base film 43 being a conductive film is formed in a thickness of around 100 nm, for example, by a sputtering method. As a material of the protective base film 43, a single layer of TiAlN, a laminated structure of TiN and TiAlN or the like, here a laminated structure of TiN and TiAlN is selected.

Next, by a sputtering method, Ir as an example is deposited in a thickness of around 100 nm to form the lower electrode layer 44.

Next, by an MOCVD method, the ferroelectric film 45 composed of, for example, PZT being a ferroelectric substance is deposited on the lower electrode layer 44 in a thickness of around 100 nm at around 450° C.-650° C., here at 550° C. On this occasion, when the ferroelectric film 45 is in an amorphous state in the initial phase of film formation, the ferroelectric film 45 is subjected to an RTA treatment to crystallize. When the ferroelectric substance 45 has already crystallized, an RTA treatment is not necessarily required.

Next, by a reactive sputtering method, for example, IrO$_2$ being a conductive oxide is deposited on the ferroelectric film 45 in a thickness of around 100 nm to form the upper electrode layer 121. In the present embodiment, an after-mentioned protective base film 98 is formed on an after-mentioned upper electrode 122, thus such conformation that a plug for connection is formed directly on the upper electrode 122 is not adopted. Consequently, apprehension is unnecessary for the etching of the upper electrode 122 at plug formation, and the upper electrode layer 121 alone is sufficient as an upper electrode material that becomes the upper electrode 52.

In this connection, as a material of the lower electrode layer 44, the ferroelectric film 45 and the upper electrode layer 121, including the above-described case, at least one selected from Ir, IrOx (typically x=2), Pt, SRO, LNO, LSCO, Ru, RuO$_2$, SrRuO$_3$ and the like is used respectively.

Next, on the upper layer upper electrode layer 47, for example, a TEOS film is deposited in a thickness of around 600 nm by a CVD method or the like to form the hard mask material 48.

Figure 12B:
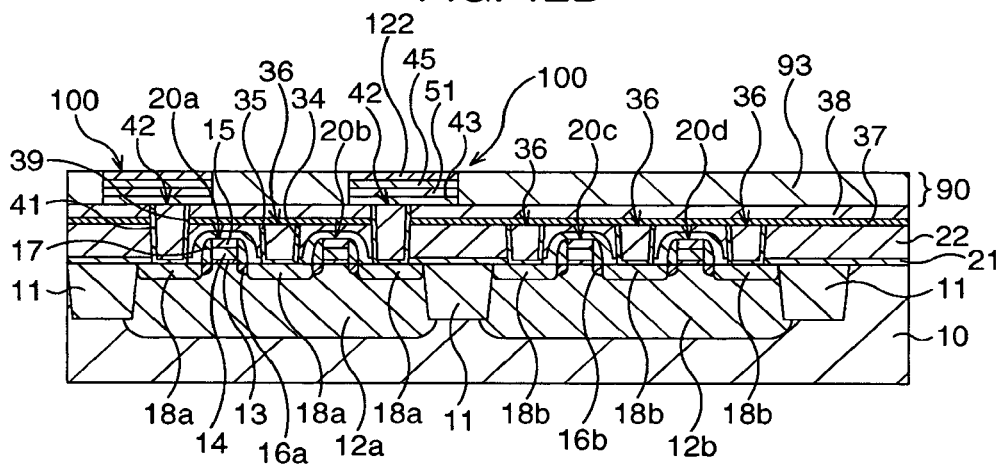

Subsequently, as shown in FIG. 12B, after forming the ferroelectric capacitor structure 100 of a lower layer, a first interlayer insulating film 93 capable of exposing the surface of the ferroelectric capacitor structure 100 (surface of the upper electrode 122) is formed.

More specifically, using the hard mask material 48, the upper electrode layer 121, the ferroelectric film 45, the lower electrode layer 44 and the protective base film 43 are etched altogether, for example, at 400° C. Then, by removing the hard mask material 48 by wet etching or the like, the ferroelectric capacitor structure 100 is completed in the N active area via the plug 42 and the protective base film 43, the structure being constituted by sandwiching the ferroelectric film 45 with the lower electrode 51 composed of the lower electrode layer 44, and the upper electrode 122 composed of the upper electrode layer 121.

Next, for example, by a high density plasma (HDP) CVD method, a silicon oxide film is deposited in a thickness of around 1300 nm so as to cover the ferroelectric capacitor structure 100, followed by flattening the surface of the silicon oxide film by CMP using the surface of the upper electrode 122 as a polishing stopper. On this occasion, the first interlayer insulating film 93 encapsulating plural (2 in the illustrated example) ferroelectric capacitor structures 100 in such state that the surface of the upper electrode 52 is exposed are formed. Here, the lower layer capacitor layer 90 is constituted by the ferroelectric capacitor structure 100 and the first interlayer insulating film 93.

Figure 12C:
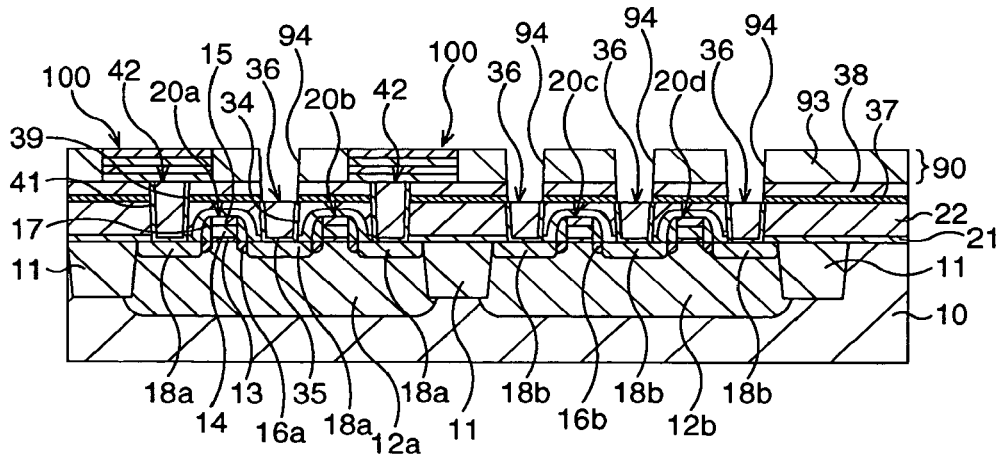

Subsequently, as shown in FIG. 12C, the via hole 94 is formed.

More specifically, by lithography and dry etching, the first interlayer insulating film 93, the plasma TEOS film 38 and the anti-oxidizing film 37 are patterned at a site matching with the upside of the plug 36 to form a via hole 94 capable of exposing a part of the surface of the plug 36.

After that, in order to recover damage given at etching of the ferroelectric capacitor structure 100, an oxygen annealing treatment is carried out. Here, for example, an annealing treatment at a treatment temperature of 500° C. in oxygen atmosphere for 60 minutes is carried out. In the present embodiment, since the protective base film 43 is disposed between the ferroelectric capacitor structure 100 and the plug 42, abnormal oxidation of the plug 42 is prevented even when the oxygen annealing treatment is carried out. Together with that, generation of hydrogen taken in the plug 42 upon forming the plug 42 is suppressed by the protective base film 43.

Figure 13A:
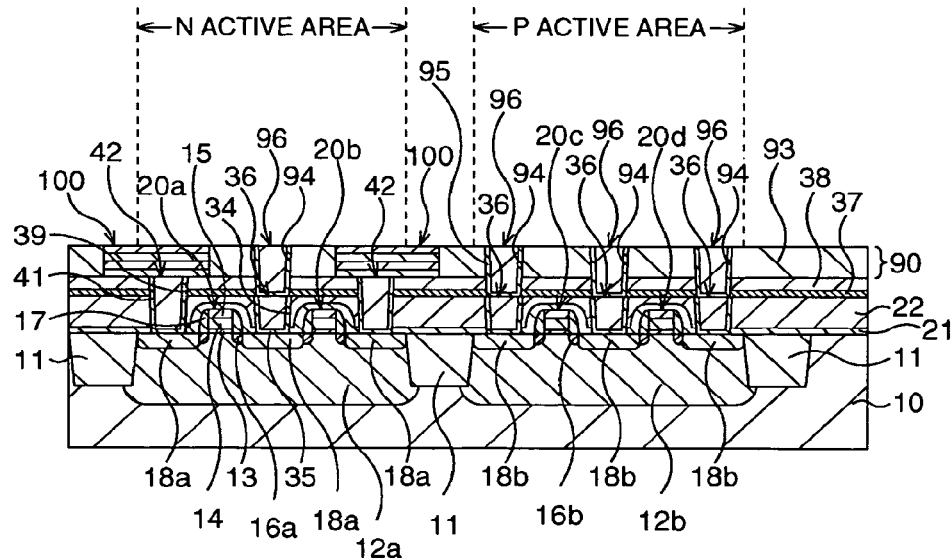
FIGS. 13A to 13C are general cross-sectional views, subsequent to FIGS. 12A to 12C, showing the constitution of the stack type FeRAM according to the modified example 2 of the first embodiment along with its manufacturing method according to the order of the steps.

Subsequently, as shown in FIG. 13A, respective plugs 96 connected with the plug 36 are formed.

More specifically, so as to cover respective wall faces of the via hole 94, for example, a TiN film is deposited in a thickness of around 75 nm by a sputtering method to form a base film (glue film) 95. Then, so as to embed the via hole 94 via the glue film 95, a single film or a laminated film of W, TiAlN, TiN, Ti, Al, Cu, Ru, SRO or Ir, here a W film is formed by a CVD method. After that, the W film and the glue film 95 are polished by CMP using the first interlayer insulating film 93 as a stopper to form the plug 96 embedding the inside of the via hole 94 with W via the glue film 95 respectively.

Figure 13B:
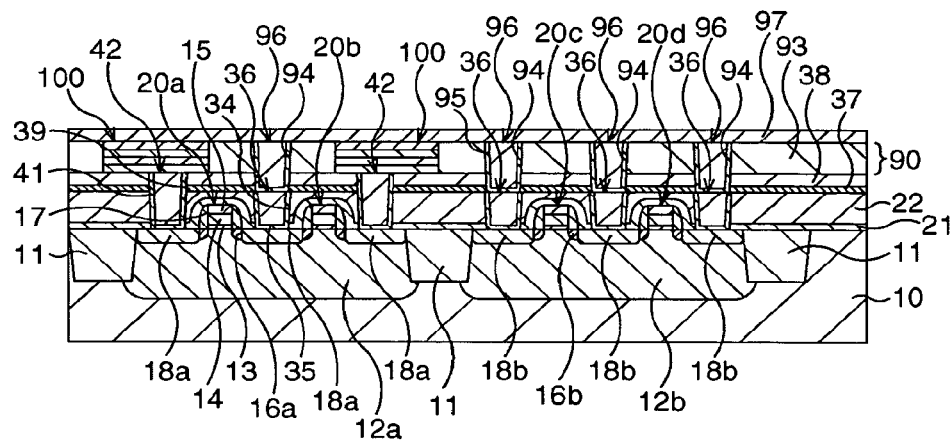

Subsequently, as shown in FIG. 13B, a conductive layer 97 to become an after-mentioned protective base film is formed.

More specifically, by a sputtering method, the conductive layer 97 having a thickness of around 100 nm is formed on the lower layer capacitor layer 90, for example, using TiAlN as a material. Here, as a material of the conductive layer 97, a laminated structure of TiN and TiAlN, Ir or the like may be used instead of TiAlN.

Figure 13C:
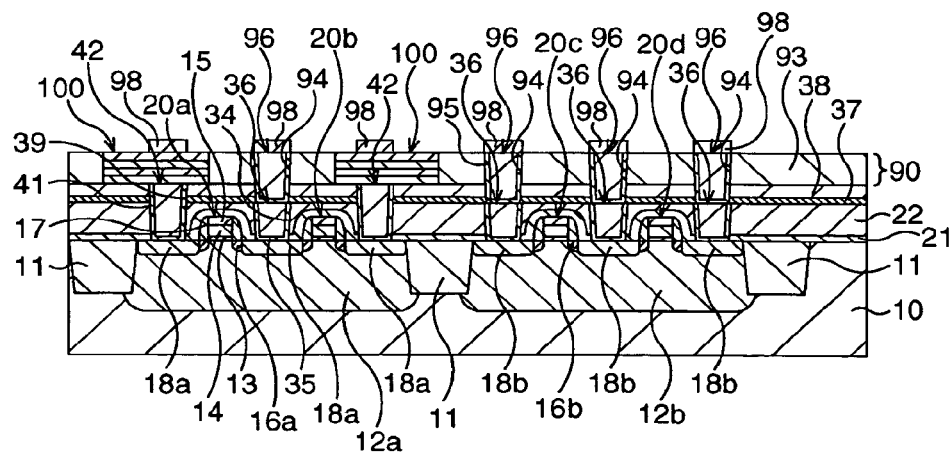

Subsequently, as shown in FIG. 13C, the conductive layer 97 is patterned to form respective protective base films 98.

More specifically, the conductive layer 97 is patterned by lithography and dry etching to form respective protective base films 98 having a size, for example, matching with the upper surface shape of respective plugs 96 (the same size also on the ferroelectric capacitor structure 30). By these protective base films 98, both of abnormal oxidation of the plug 96 caused by an after-mentioned oxygen annealing treatment of the ferroelectric film 67, and influence of hydrogen taken in the plug 96 upon forming the plug 96 on the ferroelectric film 67 are suppressed.

Figure 14A:
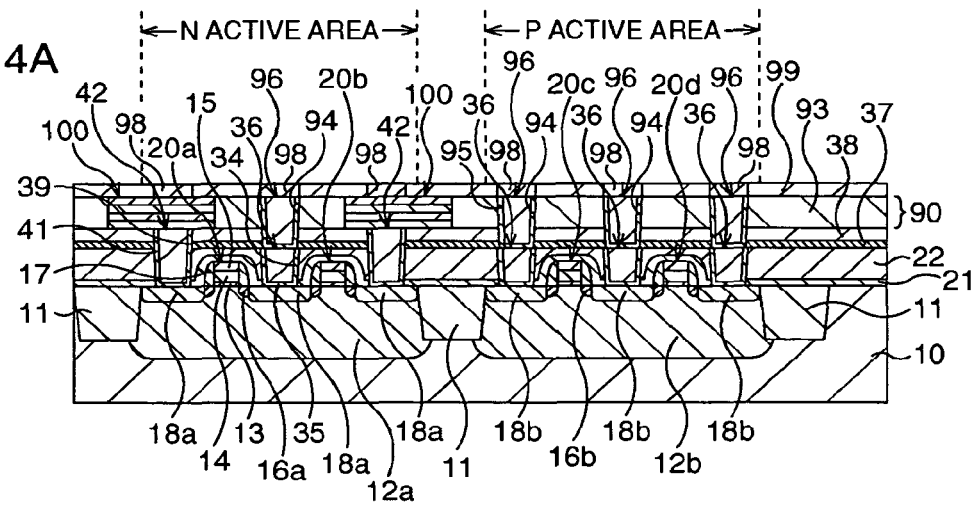
FIGS. 14A to 14C are general cross-sectional views, subsequent to FIGS. 13A to 13C, showing the constitution of the stack type FeRAM according to the modified example 2 of the first embodiment along with its manufacturing method according to the order of the steps.

Subsequently, as shown in FIG. 14A, the plasma TEOS film 99 capable of exposing the surface of respective protective base films 98 is formed.

More specifically, so as to cove respective protective base films 98, the plasma TEOS film 99 having a thickness of around 800 nm is formed by a plasma CVD method. After that, using respective protective base films 98 as a polishing stopper, the plasma TEOS film 99 is flattened by CMP.

Figure 14B:
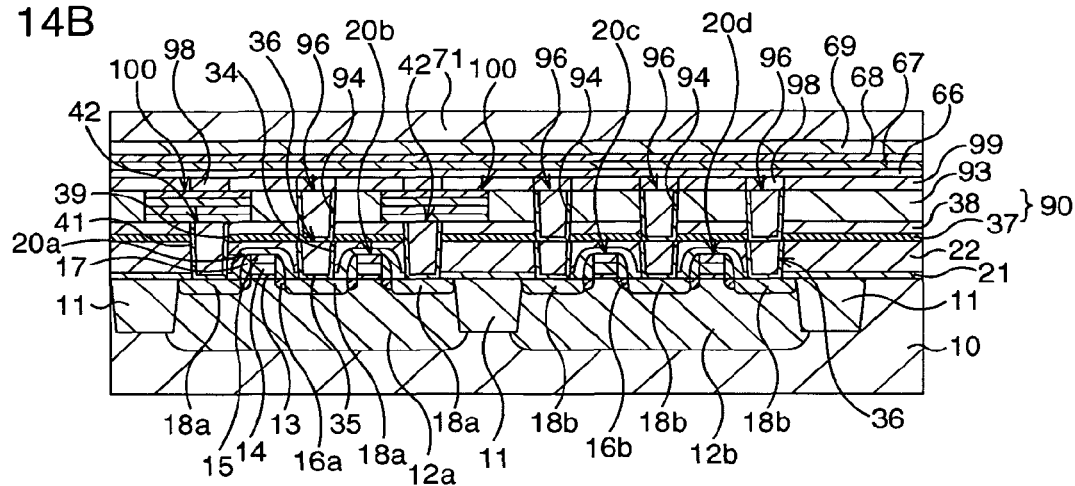

Subsequently, as shown in FIG. 14B, after forming the lower electrode layer 66, the ferroelectric film 67, the lower layer upper electrode layer 68 and the upper layer upper electrode layer 69 respectively, the hard mask material 71 is formed.

More specifically, firstly, by a sputtering method, Ir as an example is deposited in a thickness of around 100 nm to form the lower electrode layer 66.

Next, by an MOCVD method, the ferroelectric film 67 composed of, for example, PZT being a ferroelectric substance is deposited on the lower electrode layer 66 in a thickness of around 100 nm at around 450° C.-650° C., here at 550° C. On this occasion, when the ferroelectric film 67 is in an amorphous state in the initial phase of film formation, the ferroelectric film 67 is subjected to an RTA treatment to crystallize. When the ferroelectric substance 67 has already crystallized, an RTA treatment is not necessarily required.

Next, by a reactive sputtering method, for example, $IrO_2$ being a conductive oxide is deposited on the ferroelectric film 67 in a thickness of around 100 nm to form the lower layer upper electrode layer 68.

Then, by a sputtering method, for example, Ir is deposited on the lower layer upper electrode layer 68 in a thickness of around 100 nm to form the upper electrode layer 69.

In this connection, as a material of the lower electrode layer 66, the ferroelectric film 67, the lower layer upper electrode layer 68 and the upper layer upper electrode layer 69, including the above-described case, at least one selected from Ir, IrOx (typically x=2), Pt, SRO, LNO, LSCO, Ru, $RuO_2$, $SrRuO_3$ and the like is used respectively.

Next, on the upper layer upper electrode layer 69, for example, a TEOS film is deposited in a thickness of around 600 nm by a CVD method or the like to form the hard mask material 71.

Figure 14C:
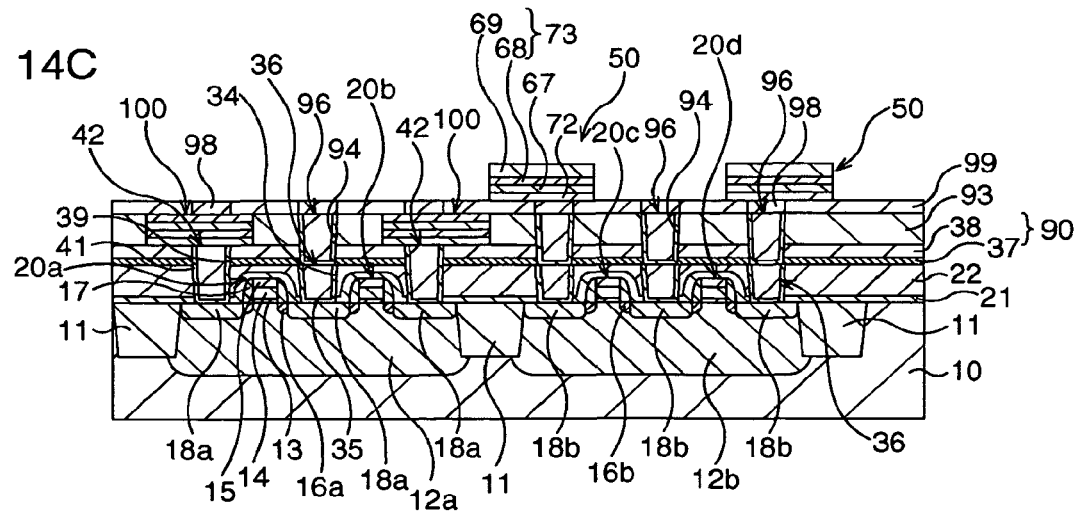

Subsequently, as shown in FIG. 14C, the ferroelectric capacitor structure 50 is formed.

More specifically, using the hard mask material 71, the upper layer upper electrode layer 69, the lower layer upper electrode layer 68, the ferroelectric film 67 and the lower electrode layer 66 are etched altogether, for example, at 400° C. Then, by removing the hard mask material 71 by wet etching or the like, the ferroelectric capacitor structure 50 is completed in the P active area, the structure being constituted by sandwiching the ferroelectric film 67 with the lower electrode 72 composed of the lower electrode layer 66, and the upper electrode 73 being a laminated structure of the lower layer upper electrode layer 68 and the upper layer upper electrode layer 69.

Figure 15A:
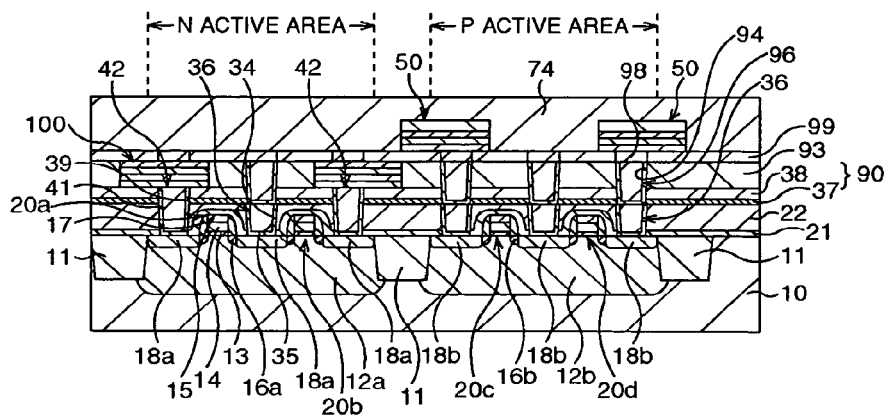
FIGS. 15A to 15C are general cross-sectional views, subsequent to FIGS. 14A to 14C, showing the constitution of the stack type FeRAM according to the modified example 2 of the first embodiment along with its manufacturing method according to the order of the steps.

Subsequently, as shown in FIG. 15A, the second interlayer insulating film 74 covering the ferroelectric capacitor structure 50 is formed.

More specifically, for example, by a high density plasma (HDP) CVD method, a silicon oxide film is deposited in a thickness of around 1300 nm so as to cover the ferroelectric capacitor structure 50, followed by flattening the surface of the silicon oxide film by CMP to form the second interlayer insulating film 74. In the second interlayer insulating film 74, plural (2 in the illustrated example) ferroelectric capacitor structures 50 are encapsulated. On this occasion, the upper layer capacitor layer 60 lying above the lower layer capacitor layer 90 is constituted by the ferroelectric capacitor structure 50 and the second interlayer insulating film 74.

Figure 15B:
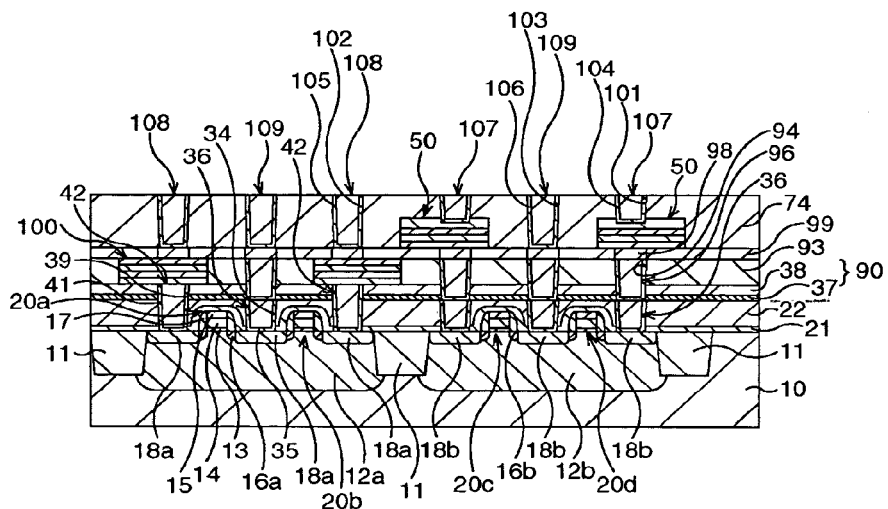

Subsequently, as shown in FIG. 15B, respective plugs 107 to be connected with the upper electrode 73 of the ferroelectric capacitor structure 50, respective plugs 108 to be connected with the upper electrode 52 of the ferroelectric capacitor structure 30 via the protective base film 98, and respective plugs 109 to be connected with the plug 96 via the protective base film 98 are formed.

More specifically, firstly, by lithography and dry etching, the second interlayer insulating film 74 is patterned at a site matching with the upside of the upper electrode 73 of the ferroelectric capacitor structure 50 to form the via hole 101 capable of exposing a part of the surface of the upper electrode 73.

After that, in order to recover damage given at etching of the ferroelectric capacitor structure 50, an oxygen annealing treatment is carried out. In the present embodiment, since the protective base film 98 is disposed between the ferroelectric capacitor structure 50 and the plug 96, abnormal oxidation of the plug 96 is prevented even when the oxygen annealing treatment is carried out. Together with that, generation of hydrogen taken in the plug 96 upon forming the plug 96 is suppressed by the protective base film 98.

Next, by lithography and dry etching, the second interlayer insulating film 74 is patterned at a site matching with the upside of respective protective base films 98 to form via holes 102, 103 capable of exposing at least a part of the surface of the protective base film 98 respectively.

Next, so as to cover respective wall faces of the via holes 101, 102, 103, for example, a TiN film is deposited in a thickness of around 75 nm by a sputtering method to form base films (glue film) 104, 105, 106. Then, so as to embed the via holes 101, 102, 103 via the glue films 104, 105, 106, a single film or a laminated film of W, TiAlN, TiN, Ti, Al, Cu, Ru, SRO or Ir, here a W film is formed by a CVD method.

After that, the W film and the glue films 104, 105, 106 are polished by CMP using the second interlayer insulating film 74 as a stopper to form the plugs 107, 108, 109 embedding the inside of the via holes 101, 102, 103 with W via the glue films 104, 105, 106 respectively.

Figure 15C:
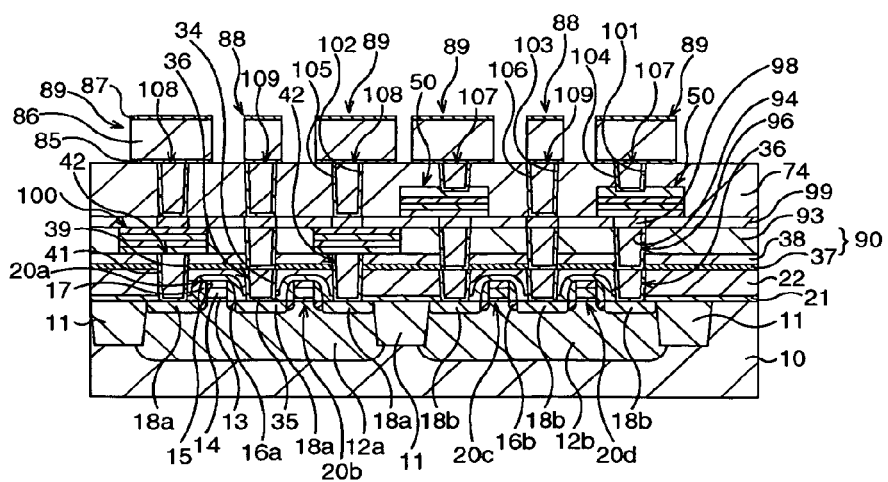

Subsequently, as shown in FIG. 15C, the bit wire 88 to be connected with the plug 109 and the plate wires 89 to be connected with the plugs 107, 108 are formed respectively.

More specifically, firstly, by a sputtering method, for example, TiN is deposited in a thickness of around 70 nm to form the barrier metal film 85.

Next, by a sputtering method, for example, an Al—Cu alloy is deposited in a thickness of around 360 nm to form the wiring layer 86.

Next, by a sputtering method, for example, a laminated film of TiN and Ti is deposited in a thickness of around 70 nm to form the barrier metal film 87.

Next, the barrier metal film 87, the wiring layer 86 and the barrier metal film 85 are patterned by lithography and dry etching. By the patterning, respective bit wires 88 to be connected with the plug 109, and respective plate wires 89 to be connected with the plugs 107, 108 are formed.

After that, through the formation of an interlayer insulating film, an upper layer wiring, a protective insulating film and the like, the stack type FeRAM according to the modified example 2 is completed. In the illustrated example, respective memory cells of the 1T1C structure are constituted by the transistor structure 20a or 20b and the ferroelectric capacitor structure 100, and the transistor structure 20c or 20d and the ferroelectric capacitor structure 50.

As described above, according to the present example, in addition to various advantages exerted by the first embodiment, it becomes possible to suppress inclusion of hydrogen into the ferroelectric films 45, 67 as far as possible as well as to suppress generation of hydrogen from the plug 96 as far as possible, and to realize an FeRAM having a high reliability.

Modified Example 3

In the modified example 3, such constitution is adopted that a ferroelectric capacitor structure of respective memory cells is alternately arranged adjacent to a lower layer capacitor layer and an upper layer capacitor layer. Further characteristics of the modified example 2 are added.

FIGS. 16A to 20B are general cross-sectional views showing the constitution of the stack type FeRAM according to the modified example 3 of the first embodiment as well as its manufacturing method according to the order of the steps.

Firstly, as is the case for the first embodiment, the protective film 21 and the insulating film 22 of the transistor structures 20a, 20b, 20c, 20d are formed through respective steps of FIGS. 1A, 1B.

Figure 16A:
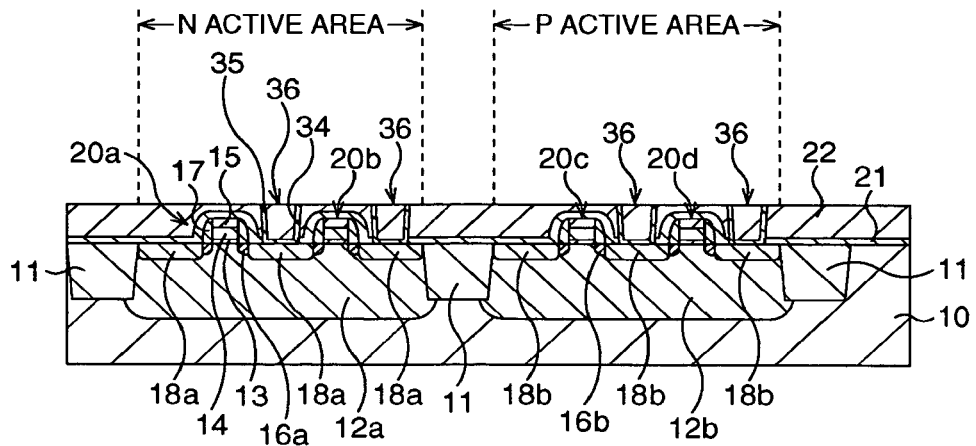
FIGS. 16A to 16C are general cross-sectional views showing the constitution of the stack type FeRAM according to the modified example 3 of the first embodiment along with its manufacturing method according to the order of the steps.

Subsequently, as shown in FIG. 16A, respective plugs 36 to be connected with either of the source/drain area 18a of the transistor structure 20a, either of the source/drain area 18b of the transistor structure 20c, and the source/drain areas 18a, 18b of the transistor structures 20b and 20d are formed.

Firstly, respective via holes 34 to the transistor structures 20a, 20b, 20c, 20d are formed.

More specifically, the insulating film 22 and the protective film 21 are processed by lithography and subsequent dry etching to form the via holes 34 capable of exposing either of the source/drain area 18a of the transistor structure 20a, either of the source/drain area 18b of the transistor structure 20c, and a part of the surface of the source/drain areas 18a, 18b of the transistor structures 20b, 20d.

Next, so as to cover respective wall faces of the via hole 34, for example, a TiN film is deposited in a thickness of around 75 nm by a sputtering method to form the base film (glue film) 35. Then, so as to embed the via hole 34 via the glue film 35, a single film or a laminated film of W, TiAlN, TiN, Ti, Al, Cu, Ru, SRO or Ir, here a W film is formed by a CVD method. After that, the W film and the glue film 35 are polished by CMP using the insulating film 21 as a stopper to form the plug 36 embedding the inside of the via hole 34 with W via the glue film 35.

Figure 16B:
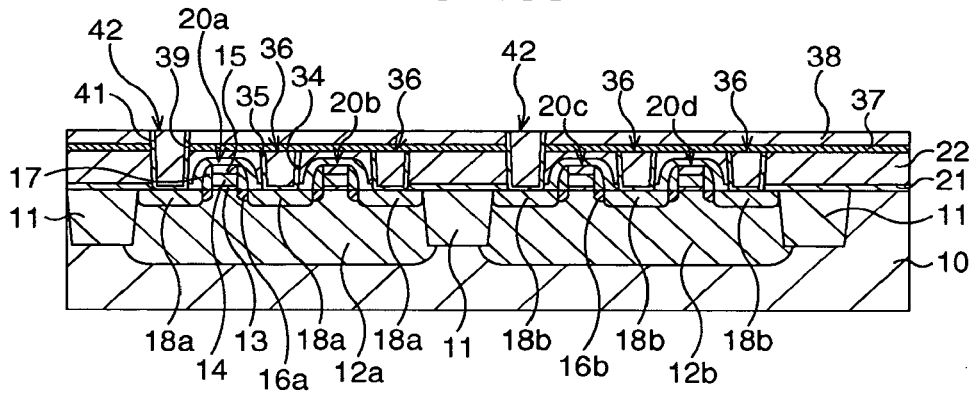

Subsequently, as shown in FIG. 16B, after forming the anti-oxidizing film 37 and the plasma TEOS film 38, respective plugs 42 to be connected with the other of the source/drain area 18a of the transistor structure 20a and the other of the source/drain area 18b of the transistor structure 20c are formed.

More specifically, firstly, the anti-oxidizing film 37 of the plug 36 is formed, for example, using SiON as a material in a thickness of around 130 nm by a CVD method or the like Next, by a plasma CVD method, the plasma TEOS film 38 having a thickness of around 200 nm is formed.

Next, the plasma TEOS film 38, the anti-oxidizing film 37, the insulating film 22, and the protective film 21 are processed by lithography and subsequent dry etching to form the via hole 39 capable of exposing a part of the other surface of the source/drain area 18a of the transistor structure 20a, and a part of the other surface of the source/drain area 18b of the transistor structure 20c respectively.

Next, so as to cover respective wall faces of the via hole 39, for example, a TiN film is deposited in a thickness of around 75 nm by a sputtering method to form the base film (glue film) 41. Then, so as to embed the via hole 39 via the glue film 41, a single film or a laminated film of W, TiAlN, TiN, Ti, Al, Cu, Ru, SRO or Ir, here a W film is formed by a CVD method. After that, the W film and the glue film 41 are polished by CMP using the plasma TEOS film 38 as a stopper to form the plug 42 embedding the inside of the via hole 39 with W via the glue film 41.

Figure 16C:
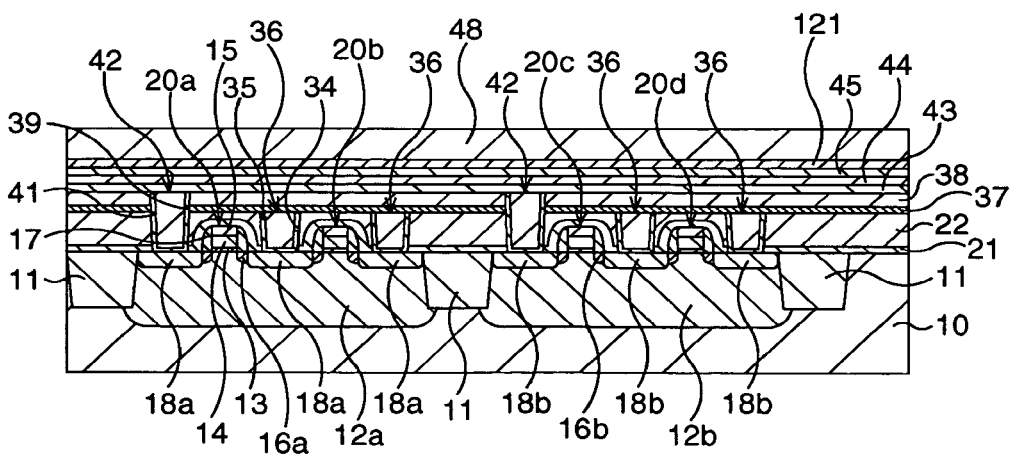

Subsequently, as shown in FIG. 16C, the protective base film 43, the lower electrode layer 44, the ferroelectric film 45 and the upper electrode layer 121 for forming an after-mentioned ferroelectric capacitor structure 100 are formed respectively.

More specifically, firstly, in order to suppress both of abnormal oxidation of the plug 42 caused by an after-mentioned oxygen annealing treatment of the ferroelectric film 45 and influence of hydrogen taken in the plug 42 upon forming the plug 42 on the ferroelectric film 45, the protective base film 43 being a conductive film is formed in a thickness of around 100 nm, for example, by a sputtering method. As a substance of the protective base film 43, a single layer of TiAlN, a laminated structure of TiN and TiAlN or the like, here a laminated structure of TiN and TiAlN is selected.

Next, by a sputtering method, Ir as an example is deposited in a thickness of around 100 nm to form the lower electrode layer 44.

Next, by an MOCVD method, the ferroelectric film 45 composed of, for example, PZT being a ferroelectric substance is deposited on the lower electrode layer 44 in a thickness of around 100 nm at around 450° C.-650° C., here at 550° C. On this occasion, when the ferroelectric film 45 is in an amorphous state in the initial phase of film formation, the ferroelectric film 45 is subjected to an RTA treatment to crystallize. When the ferroelectric substance 45 has already crystallized, an RTA treatment is not necessarily required.

Next, by a reactive sputtering method, for example, $IrO_2$ being a conductive oxide is deposited on the ferroelectric film 45 in a thickness of around 100 nm to form the upper electrode layer 121. In the present embodiment, an after-mentioned protective base film 98 is formed on an after-mentioned upper electrode 122, thus such conformation that a plug for connection is formed directly on the upper electrode 122 is not adopted. Consequently, apprehension is unnecessary for the etching of the upper electrode 122 at plug formation, and the upper electrode layer 121 alone is sufficient as an upper electrode material that becomes the upper electrode 52.

In this connection, as a material of the lower electrode layer 44, the ferroelectric film 45 and the upper electrode layer 121, including the above-described case, at least one selected from Ir, IrOx (typically x=2), Pt, SRO, LNO, LSCO, Ru, RuO$_2$, SrRuO$_3$ and the like is used respectively.

Next, on the upper layer upper electrode layer 47, for example, a TEOS film is deposited in a thickness of around 600 nm by a CVD method or the like to form the hard mask material 48.

Figure 17A:
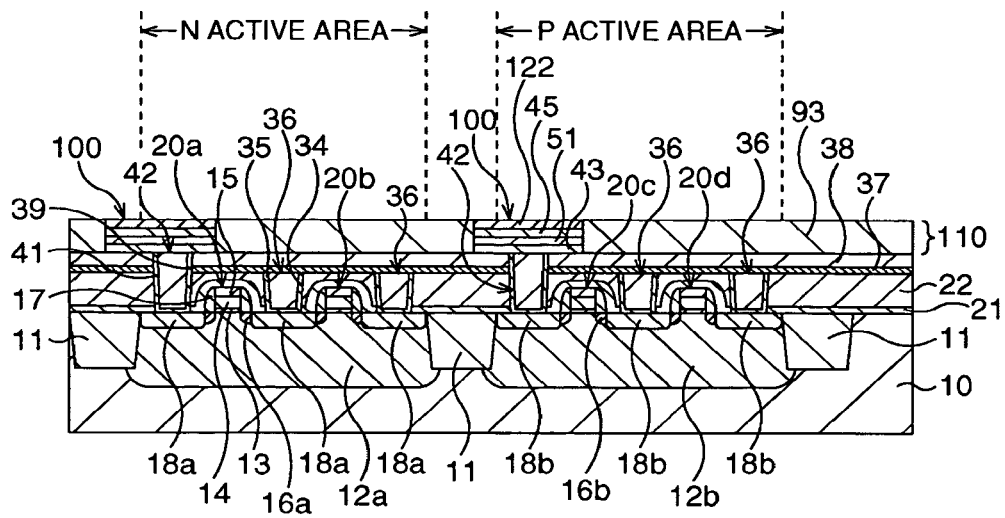
FIGS. 17A to 17C are general cross-sectional views, subsequent to FIGS. 16A to 16C, showing the constitution of the stack type FeRAM according to the modified example 3 of the first embodiment along with its manufacturing method according to the order of the steps.

Subsequently, as shown in FIG. 17A, after forming the ferroelectric capacitor structure 100 of a lower layer, the first interlayer insulating film 93 capable of exposing the surface of the ferroelectric capacitor structure 100 (surface of the upper electrode 122) is formed.

More specifically, using the hard mask material 48, the upper electrode layer 121, the ferroelectric film 45, the lower electrode layer 44 and the protective base film 43 are etched altogether, for example, at 400° C. Then, by removing the hard mask material 48 by wet etching or the like, the ferroelectric capacitor structure 100 is completed in the N active area and the P active area, respectively, via the plug 42 and the protective base film 43, the structure being constituted by sandwiching the ferroelectric film 45 with the lower electrode 51 composed of the lower electrode layer 44, and the upper electrode 122 composed of the upper electrode layer 121.

Next, for example, by a high density plasma (HDP) CVD method, a silicon oxide film is deposited in a thickness of around 1300 nm so as to cover the ferroelectric capacitor structure 100, followed by flattening the surface of the silicon oxide film by CMP using the surface of the upper electrode 122 as a polishing stopper. On this occasion, the first interlayer insulating film 93 encapsulating plural (2 in the illustrated example) ferroelectric capacitor structures 100 in such state that the surface of the upper electrode 52 is exposed are formed. Here, a lower layer capacitor layer 110 is constituted by the ferroelectric capacitor structure 100 and the first interlayer insulating film 93.

Figure 17B:
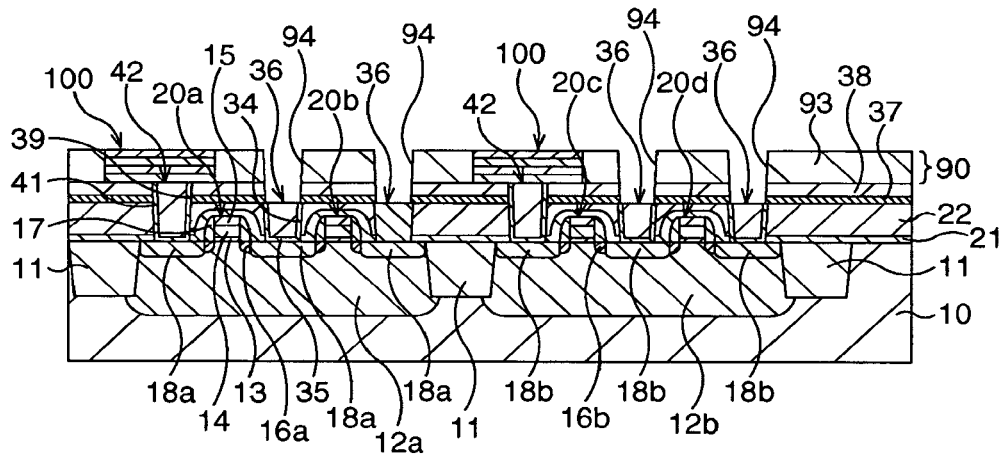

Subsequently, as shown in FIG. 17B, the via hole 94 is formed.

More specifically, by lithography and dry etching, the first interlayer insulating film 93, the plasma TEOS film 38 and the anti-oxidizing film 37 are patterned at a site matching with the upside of the plug 36 to form the via hole 94 capable of exposing a part of the surface of the plug 36.

Figure 17C:
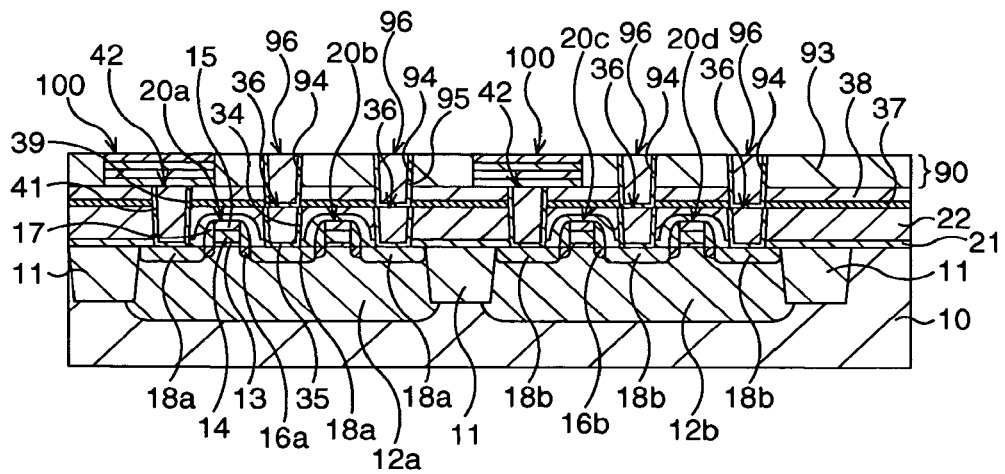

Subsequently, as shown in FIG. 17C, respective plugs 96 to be connected with the plug 36 are formed.

More specifically, so as to cover respective wall faces of the via hole 94, for example, a TiN film is deposited in a thickness of around 75 nm by a sputtering method to form the base film (glue film) 95. Then, so as to embed the via hole 94 via the glue film 95, a single film or a laminated film of W, TiAlN, TiN, Ti, Al, Cu, Ru, SRO or Ir, here a W film is formed by a CVD method. After that, the W film and the glue film 95 are polished by CMP using the first interlayer insulating film 93 as a stopper to form the plug 96 embedding the inside of the via hole 94 with W via the glue film 95 respectively.

Figure 18A:
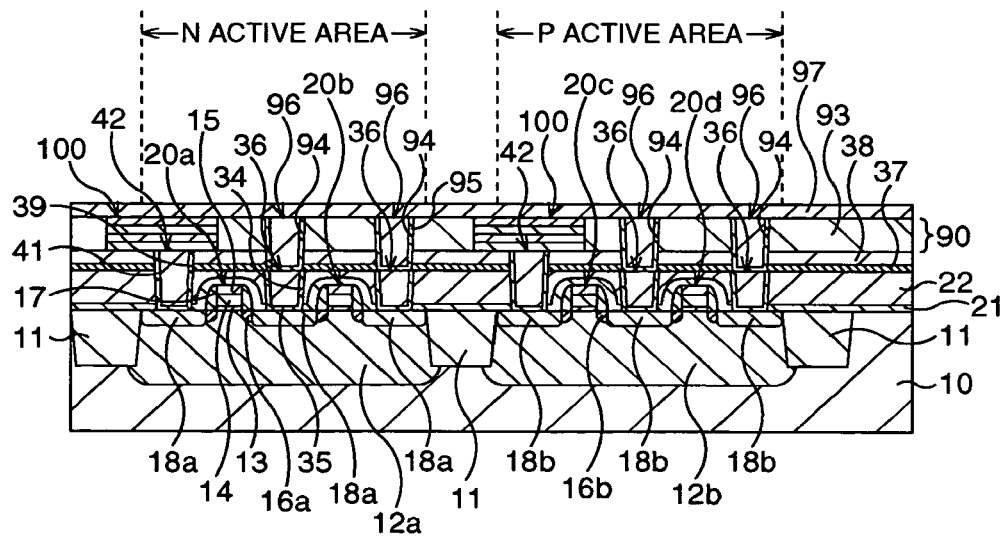
FIGS. 18A to 18C are general cross-sectional views, subsequent to FIGS. 17A to 17C, showing the constitution of the stack type FeRAM according to the modified example 3 of the first embodiment along with its manufacturing method according to the order of the steps.

Subsequently, as shown in FIG. 18A, the conductive layer 97 to become an after-mentioned protective base film is formed.

More specifically, by a sputtering method, the conductive layer 97 having a thickness of around 100 nm is formed on a lower layer capacitor layer 110, for example, using TiAlN as a material. Here, as a material of the conductive layer 97, a laminated structure of TiN and TiAlN, Ir or the like may be used instead of TiAlN.

Figure 18B:
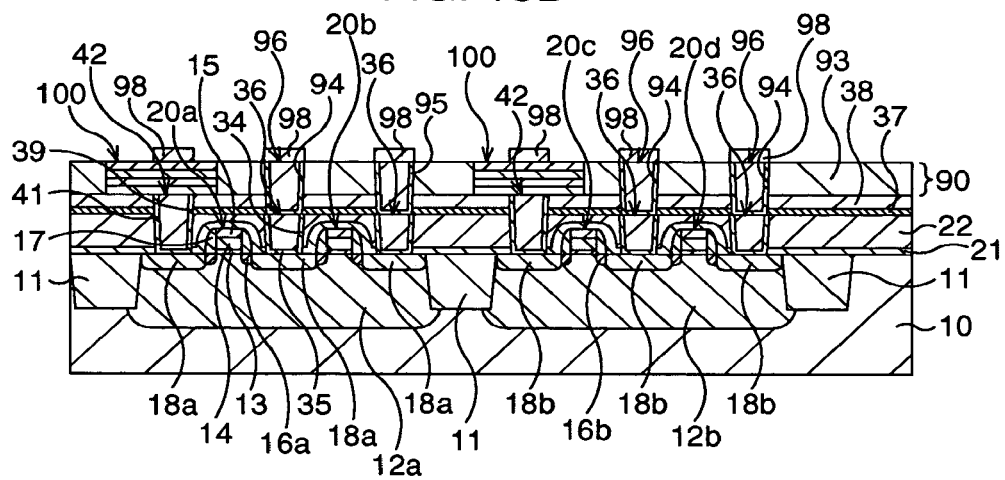

Subsequently, as shown in FIG. 18B, the conductive layer 97 is patterned to form respective protective base films 98.

More specifically, the conductive layer 97 is patterned by lithography and dry etching to form respective protective base films 98 having a size, for example, matching with the upper surface shape of respective plugs 96 (the same size also on the ferroelectric capacitor structure 30). By these protective base films 98, both of abnormal oxidation of the plug 96 caused by an after-mentioned oxygen annealing treatment of the ferroelectric film 67, and influence of hydrogen taken in the plug 96 upon forming the plug 96 on the ferroelectric film 67 are suppressed.

After that, in order to recover damage given at etching of the ferroelectric capacitor structure 30, an oxygen annealing treatment is carried out. In the present embodiment, since the protective base film 43 is disposed between the ferroelectric capacitor structure 30 and the plug 42, abnormal oxidation of the plug 42 is prevented even when the oxygen annealing treatment is carried out. Together with that, generation of hydrogen taken in the plug 42 upon forming the plug 42 is suppressed by the protective base film 43.

Figure 18C:
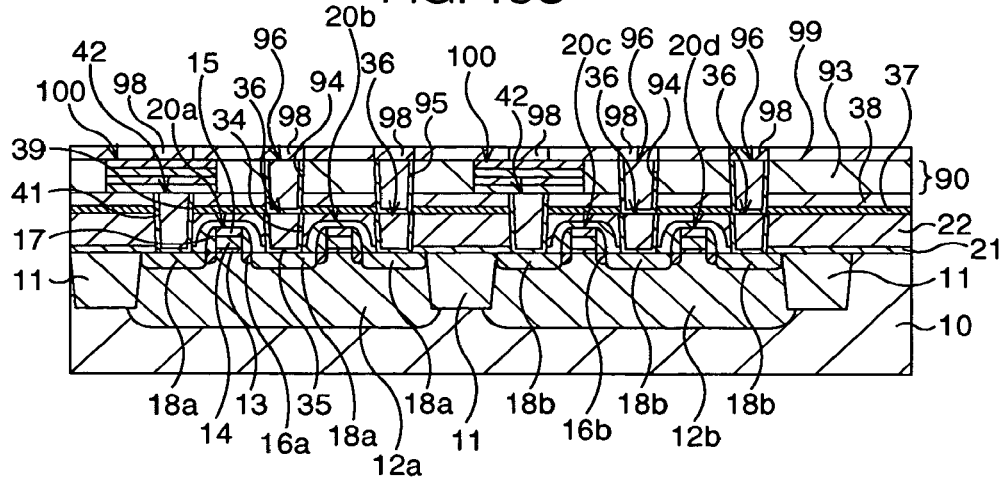

Subsequently, as shown in FIG. 18C, the plasma TEOS film 99 capable of exposing the surface of respective protective base films 98 is formed.

More specifically, so as to cover respective protective base films 98, the plasma TEOS film 99 having a thickness of around 1300 nm is formed by a plasma CVD method. After that, using respective protective base films 98 as a stopper, the plasma TEOS film 99 is flattened by CMP.

Subsequently, as shown in FIG. 19A, after forming the lower electrode layer 66, the ferroelectric film 67, the lower layer upper electrode layer 68 and the upper layer upper electrode layer 69 respectively, the hard mask material 71 is formed.

More specifically, firstly, by a sputtering method, Ir as an example is deposited in a thickness of around 100 nm to form the lower electrode layer 66.

Next, by an MOCVD method, the ferroelectric film 67 composed of, for example, PZT being a ferroelectric substance is deposited on the lower electrode layer 66 in a thickness of around 100 nm at around 450° C.-650° C., here at 550° C. On this occasion, when the ferroelectric film 67 is in an amorphous state in the initial phase of film formation, the ferroelectric film 67 is subjected to an RTA treatment to crystallize. When the ferroelectric substance 67 has already crystallized, an RTA treatment is not necessarily required.

Next, by a reactive sputtering method, for example, IrO$_2$ being a conductive oxide is deposited on the ferroelectric film 67 in a thickness of around 100 nm to form the lower layer upper electrode layer 68.

Then, by a sputtering method, for example, Ir is deposited on the lower layer upper electrode layer 68 in a thickness of around 100 nm to form the upper electrode layer 69.

In this connection, as a material of the lower electrode layer 66, the ferroelectric film 67, the lower layer upper electrode layer 68 and the upper layer upper electrode layer 69, including the above-described case, at least one selected from Ir, IrOx (typically x=2), Pt, SRO, LNO, LSCO, Ru, RuO$_2$, SrRuO$_3$ and the like is used respectively.

Next, on the upper layer upper electrode layer 69, for example, a TEOS film is deposited in a thickness of around 600 nm by a CVD method or the like to form the hard mask material 71.

Subsequently, as shown in FIG. 19B, the ferroelectric capacitor structure 50 is formed.

More specifically, using the hard mask material 71, the upper layer upper electrode layer 69, the lower layer upper electrode layer 68, the ferroelectric film 67 and the lower electrode layer 66 are etched altogether, for example, at 400° C. Then, by removing the hard mask material 71 by wet etching or the like, the ferroelectric capacitor structure 50 is completed in the N active area and the P active area respectively, the structure being constituted by sandwiching the ferroelectric film 67 with the lower electrode 72 composed of the lower electrode layer 66, and the upper electrode 73 being a laminated structure of the lower layer upper electrode layer 68 and the upper layer upper electrode layer 69.

Subsequently, as shown in FIG. 19C, the second interlayer insulating film 74 covering the ferroelectric capacitor structure 50 is formed.

More specifically, for example, by a high density plasma (HDP) CVD method, a silicon oxide film is deposited in a thickness of around 1300 nm so as to cover the ferroelectric capacitor structure 50, followed by flattening the surface of the silicon oxide film by CMP to form the second interlayer insulating film 74. In the second interlayer insulating film 74, plural (2 in the illustrated example) ferroelectric capacitor structures 50 are encapsulated. On this occasion, the upper layer capacitor layer 120 lying above the lower layer capacitor layer 90 is constituted by respective ferroelectric capacitor structures 50 in the N, P active areas and the second interlayer insulating film 74.

Figure 20A:
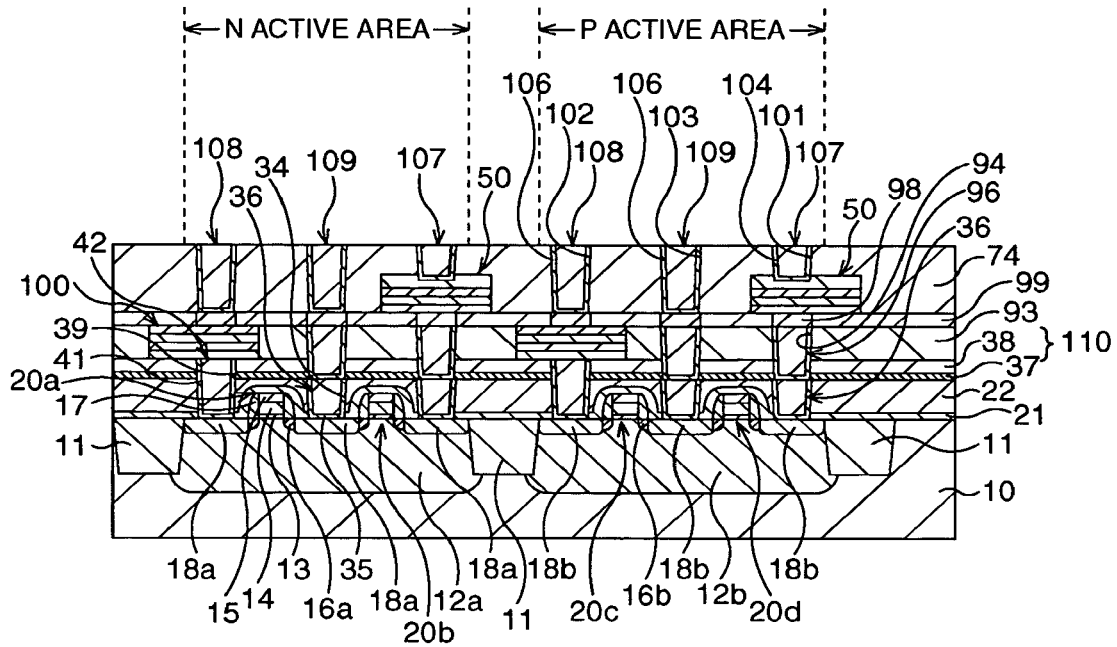
FIGS. 20A to 20B are general cross-sectional views, subsequent to FIGS. 19A to 19C, showing the constitution of the stack type FeRAM according to the modified example 3 of the first embodiment along with its manufacturing method according to the order of the steps.

Subsequently, as shown in FIG. 20A, respective plugs 107 to be connected with the upper electrode 73 of the ferroelectric capacitor structure 50, respective plugs 108 to be connected with the upper electrode 52 of the ferroelectric capacitor structure 100 via the protective base film 98, and respective plugs 109 to be connected with the plug 96 via the protective base film 98 are formed.

More specifically, firstly, by lithography and dry etching, the second interlayer insulating film 74 is patterned at a site matching with the upside of the upper electrode 73 of the ferroelectric capacitor structure 50 to form the via hole 101 capable of exposing a part of the surface of the upper electrode 73.

After that, in order to recover damage given at etching of the ferroelectric capacitor structure 50, an oxygen annealing treatment is carried out. In the present embodiment, since the protective base film 98 is disposed between the ferroelectric capacitor structure 50 and the plug 96, abnormal oxidation of the plug 96 is prevented even when the oxygen annealing treatment is carried out. Together with that, generation of hydrogen taken in the plug 96 upon forming the plug 96 is suppressed by the protective base film 98.

Next, by lithography and dry etching, the second interlayer insulating film 74 is patterned at a site matching with the upside of respective protective base films 98 to form the via holes 102, 103 capable of exposing at least a part of the surface of the protective base film 98 respectively.

Next, so as to cover respective wall faces of the via holes 101, 102, 103, for example, a TiN film is deposited in a thickness of around 75 nm by a sputtering method to form the base films (glue film) 104, 105, 106. Then, so as to embed the via holes 101, 102, 103 via the glue films 104, 105, 106, a single film or a laminated film of W, TiAlN, TiN, Ti, Al, Cu, Ru, SRO or Ir, here a W film is formed by a CVD method. After that, the W film and the glue films 104, 105, 106 are polished by CMP using the second interlayer insulating film 74 as a stopper to form the plugs 107, 108, 109 embedding the inside of the via holes 101, 102, 103 with W via the glue films 104, 105, 106 respectively.

Figure 20B:
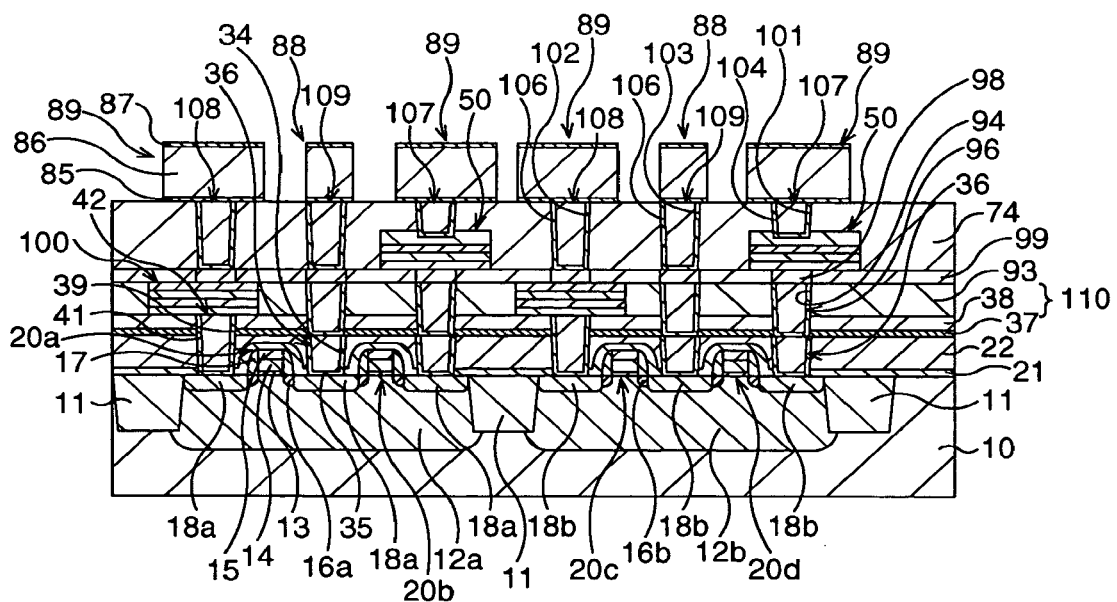

Subsequently, as shown in FIG. 20B, the bit wire 88 to be connected with the plug 109 and the plate wire 89 to be connected with the plugs 107, 108 are formed respectively.

More specifically, firstly, by a sputtering method, for example, TiN is deposited in a thickness of around 60 nm to form the barrier metal film 85.

Next, by a sputtering method, for example, an Al—Cu alloy is deposited in a thickness of around 360 nm to form the wiring layer 86.

Next, by a sputtering method, for example, a laminated film of TiN and Ti is deposited in a thickness of around 70 nm to form the barrier metal film 87.

Next, the barrier metal film 87, the wiring layer 86 and the barrier metal film 85 are patterned by lithography and dry etching. By the patterning, respective bit wires 88 to be connected with the plug 109, and respective plate wires 89 to be connected with the plugs 107, 108 are formed.

After that, through the formation of an interlayer insulating film, the upper layer wiring, the protective insulating film and the like, the stack type FeRAM according to the modified example 2 is completed. In the illustrated example, respective memory cells of the 1T1C structure are constituted by the transistor structure 20a or 20c and the ferroelectric capacitor structure 100, and the transistor structure 20b or 20d and the ferroelectric capacitor structure 50. That is, such constitution is adopted that ferroelectric capacitor structures 100, 50 are alternately arranged adjacent to the lower layer capacitor layer 110 and the upper layer capacitor layer 120.

As described above, according to the present example, in addition to various advantages exerted by the first embodiment, it becomes possible to suppress inclusion of hydrogen into the ferroelectric films 45, 67 as far as possible as well as to suppress generation of hydrogen from the plug 96 as far as possible, and to realize an FeRAM having a high reliability.

Second Embodiment

In a second embodiment, the constitution of a planar type FeRAM and its manufacturing method will be described.

FIGS. 21A to 25C are general cross-sectional views showing the constitution of the planar type FeRAM according to the second embodiment along with its manufacturing method according to the order of the steps.

Figure 21A:
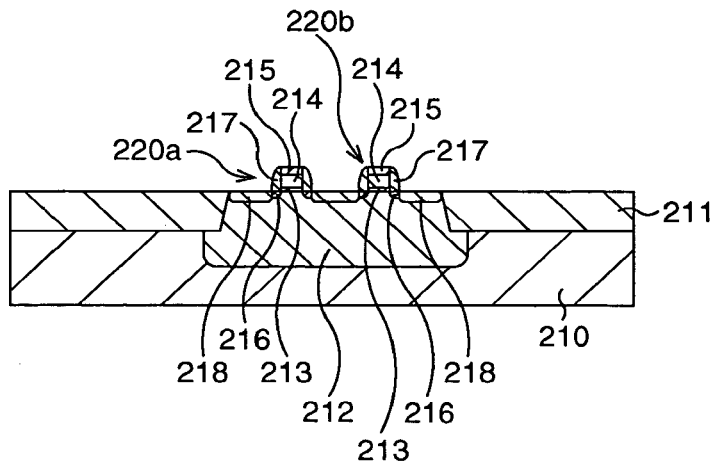
FIGS. 21A to 21C are general cross-sectional views showing the constitution of the planar type FeRAM according to the second embodiment along with its manufacturing method according to the order of the steps.

Firstly, as shown in FIG. 21A, transistor structures 220a, 220b to function as a selection transistor is formed on a silicon semiconductor substrate 210.

More specifically, an element isolating structure 211 is formed, for example, by an STI (Shallow Trench Isolation) method on the superficial layer of the silicon semiconductor substrate 210 to determine an element active area.

Next, the element active area is ion-implanted with an impurity, here B, for example, under conditions of a dose amount of $3.0 \times 10^{13}/cm^2$ and an acceleration energy of 300 keV to form a well 212.

Next, by forming a thin gate insulating film 213 having a thickness of around 3.0 nm in the element active area by a thermal oxidation or the like, depositing a polycrystalline silicon film having a thickness of around 180 nm and a silicon nitride film as an example having a thickness of around 29 nm on the gate insulating film 213 by a CVD method, and processing the silicon nitride film, the polycrystalline silicon film and the gate insulating film 213 into an electrode shape by lithography and subsequent dry etching, a gate electrode 214 is pattern-formed on the gate insulating film 213. Simultaneously, a cap film 215 composed of the silicon nitride film is pattern-formed on the gate electrode 214.

Next, the element active area is ion-implanted with an impurity, here As, for example, under conditions of a dose amount of $5.0 \times 10^{14}/cm^2$ and an acceleration energy of 10 keV using the cap film 215 as a mask to form a so-called LDD area 216.

Next, for example, a silicon oxide film is deposited on the whole surface by a CVD method, and the silicon oxide film is subjected to so-called etch back to form a sidewall insulating film 217 while leaving the silicon oxide film only on the side face of the gate electrode 214 and the cap film 215.

Next, the element active area is ion-implanted with an impurity, here P under such conditions as giving a higher impurity concentration than that in the LDD area 216, for example, a dose amount of $5.0 \times 10^{14}/cm^2$ and an acceleration energy of 13 keV using the cap film 215 and the sidewall insulating film 217 as a mask to form a source/drain area 218 to be overlapped with the LDD area 216, thereby completing transistor structures 220a, 220b.

Figure 21B:
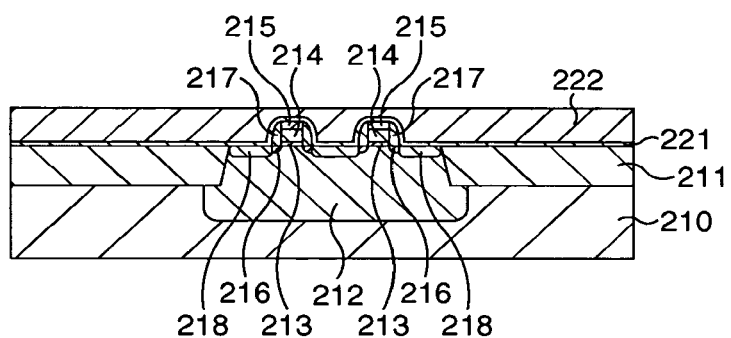

Subsequently, as shown in FIG. 21B, a protective film 221 and an insulating film 222 of the transistor structures 220a, 220b are formed.

More specifically, so as to cover the transistor structures 220a, 220b, the protective film 221 and the insulating film 222 are deposited sequentially. Here, as the protective film 221, a silicon oxide film is used as a material to be deposited in a thickness of around 20 nm by a CVD method. As the insulating film 222, a laminated structure prepared, for example, by sequentially film-forming a plasma SiO film (thickness of around 20 nm), a plasma SiN film (thickness of around 80 nm) and a plasma TEOS film (thickness of around 1000 nm) is formed and, after the lamination, it is polished till the thickness becomes around 700 nm by CMP.

Figure 21C:
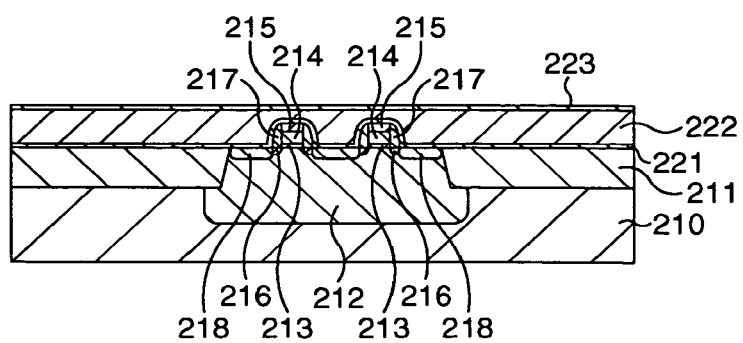

Subsequently, as shown in FIG. 21C, an orientation improving film of a lower electrode of an after-mentioned ferroelectric capacitor structure 230 is formed.

More specifically, for example, a silicon oxide film is deposited on the insulating film 222 to form the orientation improving film 223.

Figure 22A:
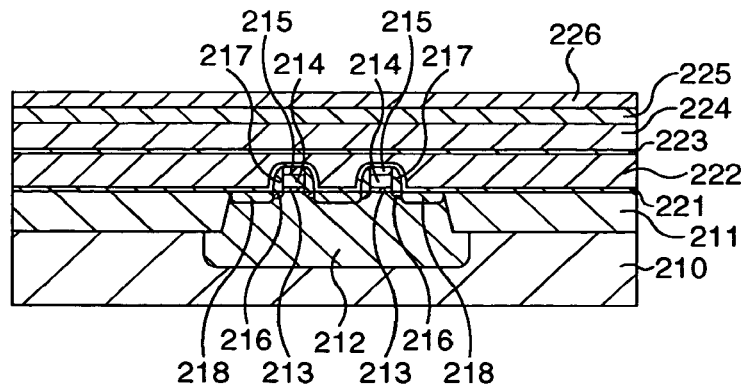
FIGS. 22A to 22C are general cross-sectional views, subsequent to FIGS. 21A to 21C, showing the constitution of the planar type FeRAM according to the second embodiment along with its manufacturing method according to the order of the steps.

Subsequently, as shown in FIG. 22A, a lower electrode layer 224, a ferroelectric film 225 and an upper electrode layer 226 are formed sequentially.

More specifically, firstly, for example, a Ti film having a thickness of around 20 nm and a Pt film having a thickness of around 150 nm are deposited sequentially by a sputtering method to form the lower electrode layer 224 to a laminated structure of the Ti film and the Pt film.

Next, by an MOCVD method, the ferroelectric film 225 composed of, for example, PZT being a ferroelectric substance is deposited on the lower electrode layer 224 in a thickness of around 200 nm at around 450° C.-550° C., here at 500° C. Then, the ferroelectric film 225 is subjected to an RTA treatment to crystallize the ferroelectric film 225.

Next, by a reactive sputtering method, an upper electrode layer 226 is deposited, for example, using $IrO_2$ being a conductive oxide as a material on the ferroelectric film 225 in a thickness of around 200 nm. In this connection, as a material of the upper electrode layer 226, Ir, Ru, $RuO_2$, $SrRuO_3$ or other conductive oxide, or a laminated structure thereof may be used instead of $IrO_2$.

Figure 22B:
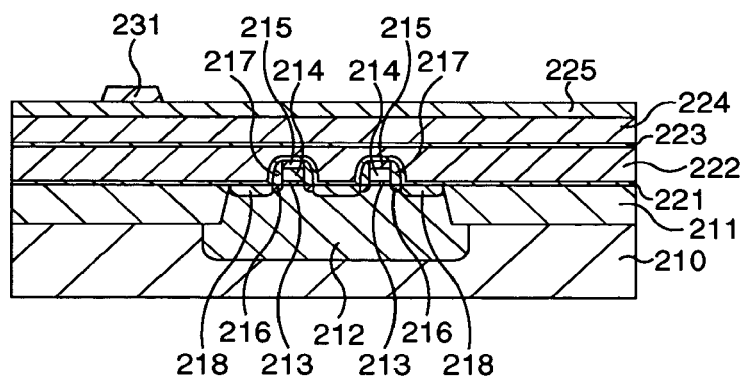

Subsequently, as shown in FIG. 22B, the upper electrode 231 is pattern-formed.

More specifically, the upper electrode layer 226 is processed into plural electrode shapes by lithography and subsequent dry etching to pattern-form the upper electrode 231.

Figure 22C:
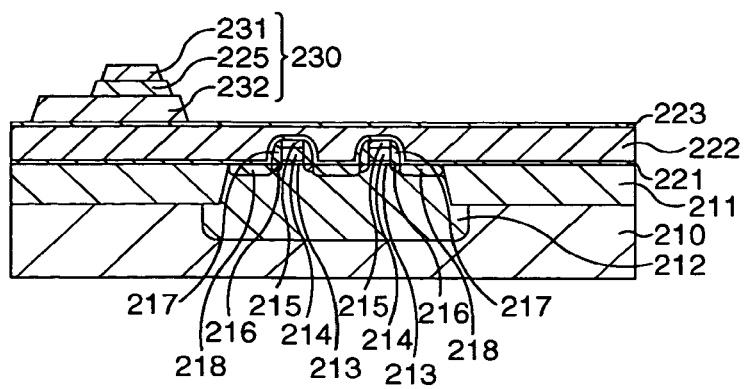

Subsequently, as shown in FIG. 22C, the ferroelectric film 225 and the lower electrode layer 224 are processed to form the ferroelectric capacitor structure 230 of a lower layer.

More specifically, firstly, the ferroelectric film 225 is processed so as to have a size slightly larger than the upper electrode 231 while matching it with the upper electrode 231 by lithography and subsequent dry etching.

Next, the lower electrode layer 224 is processed so as to have a size slightly larger than the ferroelectric film 225 while matching it with the processed ferroelectric film 225 by lithography and subsequent dry etching to pattern-form a lower electrode 232. Hereby the ferroelectric capacitor structure 230, in which the ferroelectric film 225 and the upper electrode 231 are laminated sequentially on the lower electrode 232, and the lower electrode 232 and the upper electrode 231 are capacitively coupled via the ferroelectric film 225, is completed.

After that, in order to recover damage given at etching the ferroelectric film 225, an oxygen annealing treatment is carried out.

Figure 23A:
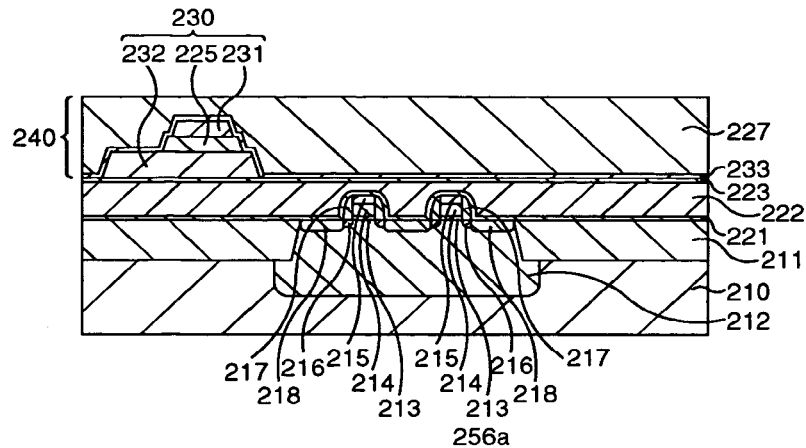
FIGS. 23A to 23C are general cross-sectional views, subsequent to FIGS. 22A to 22C, showing the constitution of the planar type FeRAM according to the second embodiment along with its manufacturing method according to the order of the steps.

Subsequently, as shown in FIG. 23A, after forming a protective insulating film 233 covering the ferroelectric capacitor structure 230, the first interlayer insulating film 227 is formed.

More specifically, so as to cover the ferroelectric capacitor structure 230, a metal oxide film, for example, using alumina as a material is deposited on the orientation improving film 223 in a thickness of around 30 nm by a sputtering method to form the protective insulating film 233. By the protective insulating film 233, intrusion of moisture/hydrogen, for example, from a silicon oxide film or the like formed in a later step into the ferroelectric film 225 is suppressed, and damage to the ferroelectric film 225 is prevented.

Next, for example, by a high density plasma (HDP) CVD method, a silicon oxide film is deposited in a thickness of around 1300 nm so as to cover the ferroelectric capacitor structure 230 via the protective insulating film 233, followed by flattening the surface of the silicon oxide film by CMP to form the first interlayer insulating film 227. In the first interlayer insulating film 227, plural (1 in the illustrated example) ferroelectric capacitor structures 230 are encapsulated via the protective insulating film 233. On this occasion, a lower layer capacitor layer 240 is constituted by the ferroelectric capacitor structure 230, the protective insulating film 233 and the first interlayer insulating film 227.

Figure 23B:
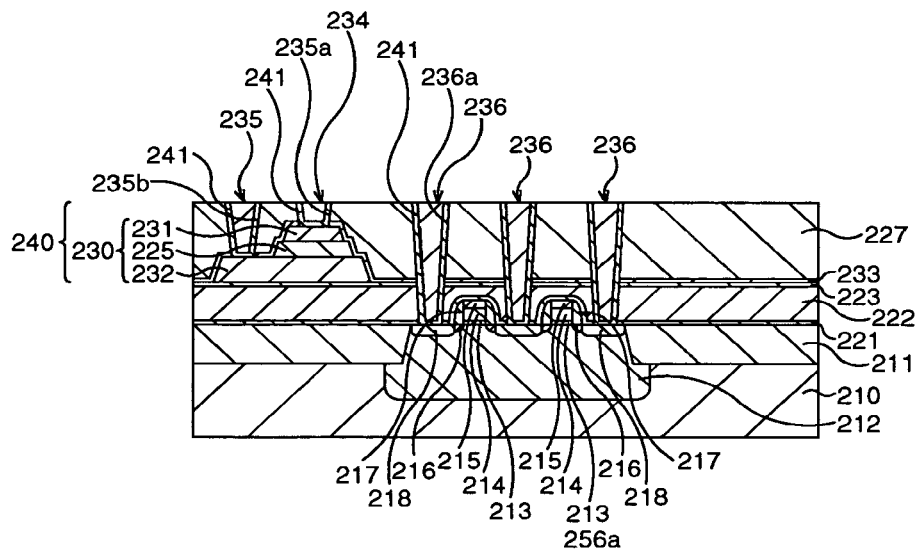

Subsequently, as shown in FIG. 23B, plugs 234, 235 to be connected with the upper electrode 231 and the lower electrode 232 of the ferroelectric capacitor structure 230, and a plug 236 to be connected with the source/drain area 218 of the transistor structures 220a, 220b are formed.

Firstly, via holes 234a, 235a to the ferroelectric capacitor structure 230 are formed.

More specifically, as lithography and subsequent dry etching, a process to be given to the first interlayer insulating film 227 and the protective insulating film 233 till a part of the surface of the upper electrode 231 is exposed, and a process to be given to the first interlayer insulating film 227 and the protective insulating film 233 till a part of the surface of the lower electrode 232 is exposed are carried out simultaneously to simultaneously form the via holes 234a, 235a, for example, having a diameter of about 0.5 μm at respective sites. Upon forming these via holes 234a, 235a, the upper electrode 231 and the lower electrode 232 function respectively as an etching stopper.

Next, an annealing treatment for recovering damage given to the ferroelectric capacitor structure 230 in various steps after the formation of the ferroelectric capacitor structure 230 is carried out. Here, for example, an annealing treatment at a treatment temperature of 500° C. in oxygen atmosphere for 60 minutes is carried out.

Next, a via hole 236a to the source/drain area 218 of the transistor structures 220a, 220b is formed.

More specifically, using the source/drain area 218 as an etching stopper, the first interlayer insulating film 127, the protective insulating film 233, the orientation improving film 223, the insulating film 222 and the protective film 221 are processed by lithography and subsequent dry etching till a part of the surface of the source/drain area 218 is exposed to form the via hole 236a, for example, having a diameter of about 0.3 μm.

Next, the plugs 234, 235, 236 are formed.

Firstly, after carrying out an RF pretreatment corresponding to several tens nm in terms of etching of a usual oxide film, here around 10 nm, so as to cover respective wall faces of the via holes 234a, 235a, 236a, for example, a TiN film is deposited in a thickness of around 75 nm by a sputtering method to form a base film (glue film) 241. Then, for example, a W film is formed so as to embed the via holes 234a, 235a, 236a via the glue film 241 by a CVD method. After that, the W film and the glue film 241 is polished by CMP using the first interlayer insulating film 227 as a stopper to form the plugs 234, 235, 236 embedding the inside of the via holes 234a, 235a, 236a with W via the glue film 241.

Figure 23C:
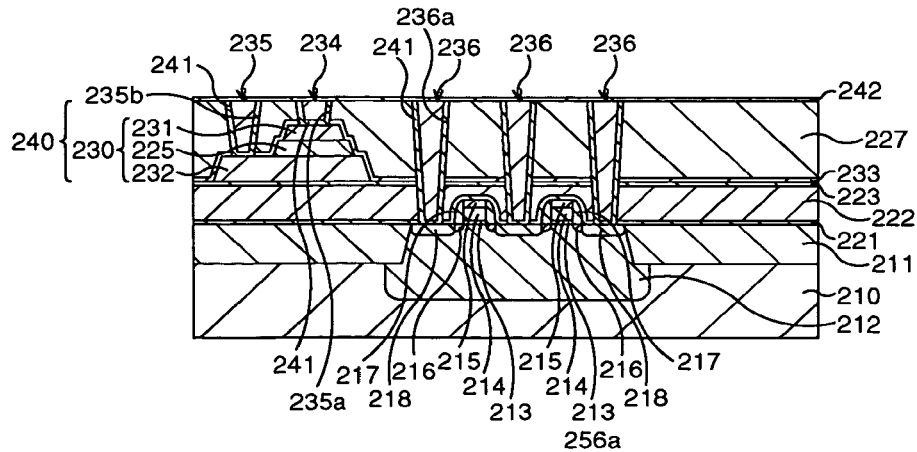

Subsequently, as shown in FIG. 23C, an orientation improving film 242 of a lower electrode of an after-mentioned ferroelectric capacitor structure 250.

More specifically, for example, a silicon oxide film is deposited on the first interlayer insulating film 227 to form the orientation improving film 242.

Figure 24A:
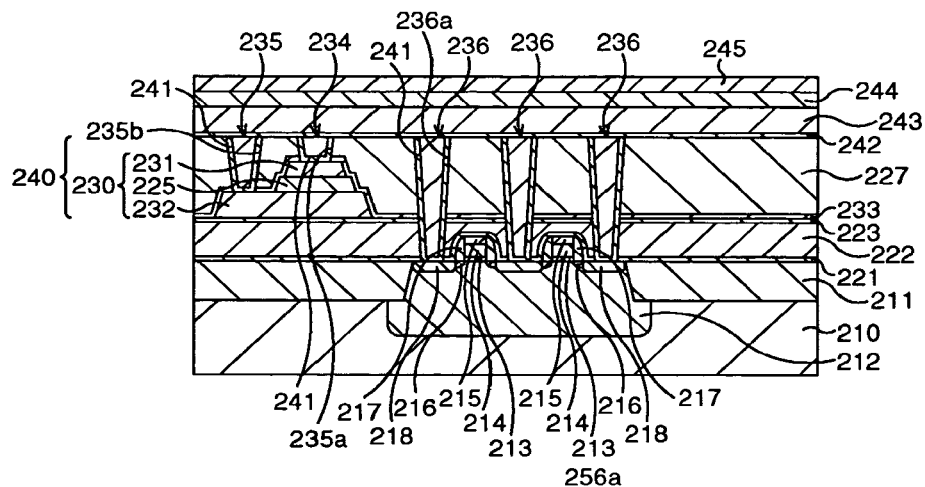
FIGS. 24A to 24C are general cross-sectional views, subsequent to FIGS. 23A to 23C, showing the constitution of the planar type FeRAM according to the second embodiment along with its manufacturing method according to the order of the steps.

Subsequently, as shown in FIG. 24A, a lower electrode layer 243, a ferroelectric film 244 and an upper electrode layer 245 are formed sequentially.

More specifically, firstly, for example, a TiN film having a thickness of around 20 nm and a Pt film having a thickness of around 150 nm are formed sequentially by a sputtering method to form the lower electrode layer 243 to the laminated structure of the Ti film and the Pt film.

Next, by an MOCVD method, a ferroelectric film 244 composed of, for example, PZT being a ferroelectric substance is formed on the lower electrode layer 243 in a thickness of around 200 nm at around 450° C.-550° C., here at 500° C. Then, the ferroelectric film 244 is subjected to an RTA treatment to crystallize the ferroelectric film 244.

Next, by a reactive sputtering method, an upper electrode layer 245 is deposited, for example, using $IrO_2$ being a conductive oxide as a material on the ferroelectric film 244 in a thickness of around 200 nm. In this connection, as a material of the upper electrode layer 245, Ir, Ru, $RuO_2$, $SrRuO_3$ or other conductive oxides, or a laminated structure thereof may be used instead of $IrO_2$.

Figure 24B:
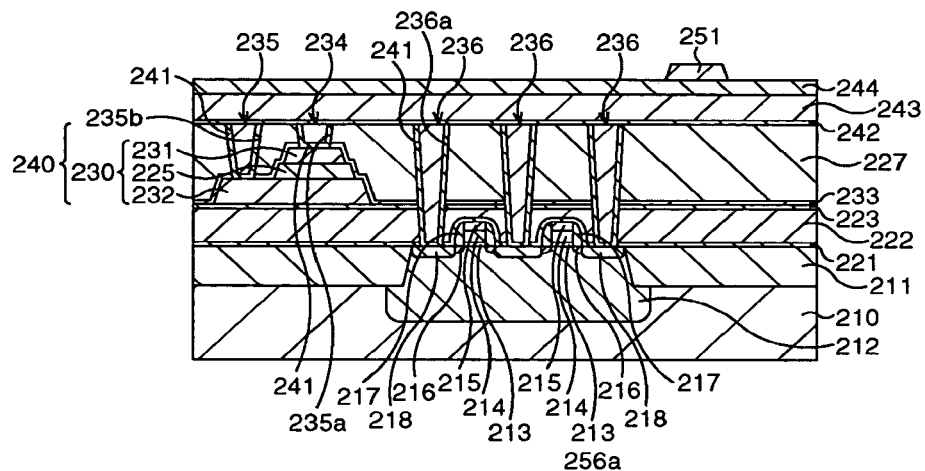

Subsequently, as shown in FIG. 24B, an upper electrode 251 is pattern-formed.

More specifically, the upper electrode layer 245 is processed into plural electrode shapes by lithography and subsequent dry etching to pattern-form the upper electrode 251.

Figure 24C:
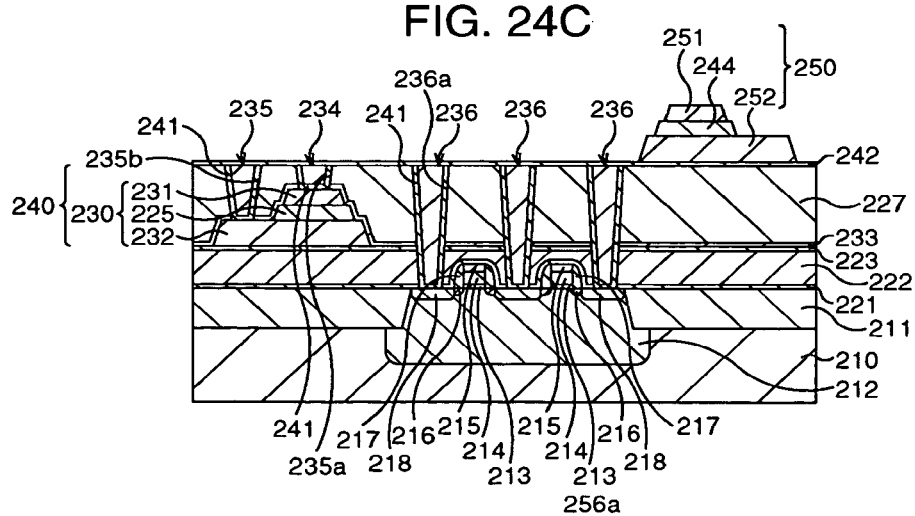

Subsequently, as shown in FIG. 24C, the ferroelectric film 244 and the lower electrode layer 243 are processed to form the ferroelectric capacitor structure 250 of an upper layer.

More specifically, firstly ferroelectric film 244 is processed so as to have a size slightly larger than the upper electrode 251 while matching it with the upper electrode 251 by lithography and subsequent dry etching.

Next, the lower electrode layer 243 is processed so as to have a size slightly larger than the ferroelectric film 244 while matching it with the processed ferroelectric film 244 by lithography and subsequent dry etching to pattern-form a lower electrode 252. Hereby the ferroelectric capacitor structure 250, in which the ferroelectric film 244 and the upper electrode 251 are laminated sequentially on the lower electrode 252, and the lower electrode 252 and the upper electrode 251 are capacitively coupled via the ferroelectric film 244, is completed.

After that, in order to recover damage given at etching the ferroelectric film 244, an oxygen annealing treatment is carried out.

Figure 25A:
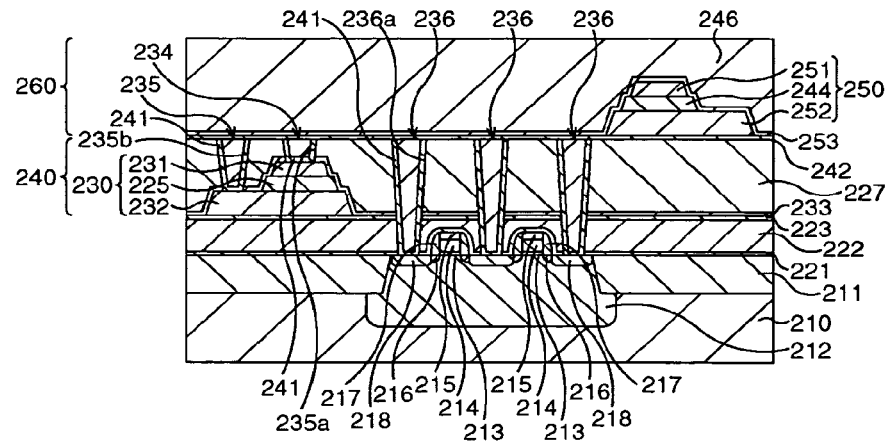
FIGS. 25A to 25C are general cross-sectional views, subsequent to FIGS. 24A to 24C, showing the constitution of the planar type FeRAM according to the second embodiment along with its manufacturing method according to the order of the steps.

Subsequently, as shown in FIG. 25A, after forming a protective insulating film 253 covering the ferroelectric capacitor structure 250, a second interlayer insulating film 246 is formed.

More specifically, so as to cover the ferroelectric capacitor structure 250, a metal oxide film, for example, using alumina as a material is deposited on the orientation improving film 242 in a thickness of around 30 nm by a sputtering method to form a protective insulating film 253. By the protective insulating film 253, intrusion of moisture/hydrogen, for example, from a silicon oxide film or the like formed in a later step into the ferroelectric film 244 is suppressed, and damage to the ferroelectric film 244 is prevented.

Next, for example, by a high density plasma (HDP) CVD method, a silicon oxide film is deposited in a thickness of around 1300 nm so as to cover the ferroelectric capacitor structure 250 via the protective insulating film 253, followed by flattening the surface of the silicon oxide film by CMP to form the second interlayer insulating film 246. In the second interlayer insulating film 246, plural (1 in the illustrated example) ferroelectric capacitor structures 250 are encapsulated via the protective insulating film 253. On this occasion, an upper layer capacitor layer 260 lying above the lower layer capacitor layer 240 is constituted by the ferroelectric capacitor structure 250, the protective insulating film 253 and the first interlayer insulating film 246.

Figure 25B:
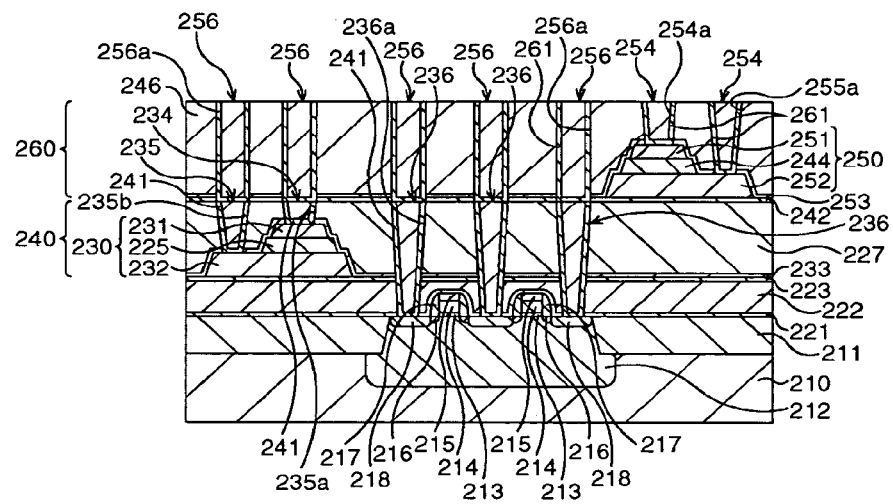

Subsequently, as shown in FIG. 25B, plugs 254, 255 to be connected with the upper electrode 251 and the lower electrode 252 of the ferroelectric capacitor structure 250, and a plug 256 to be connected with the plugs 234, 235, 236 are formed respectively.

Firstly, via holes 254a, 255a to the ferroelectric capacitor structure 250 are formed.

More specifically, as lithography and subsequent dry etching, a process to be given to the second interlayer insulating film 246 and the protective insulating film 253 till a part of the surface of the upper electrode 251 is exposed, and a process to be given to the second interlayer insulating film 246 and the protective insulating film 253 till a part of the surface of the lower electrode 252 is exposed are carried out simultaneously to simultaneously form the via holes 254a, 255a, for example, having a diameter of about 0.5 μm at respective sites. Upon forming these via holes 254a, 255a, the upper electrode 251 and the lower electrode 252 function respectively as an etching stopper.

Next, an annealing treatment for recovering damage given to the ferroelectric capacitor structure 250 in various steps after the formation of the ferroelectric capacitor structure 250 is carried out. Here, for example, an annealing treatment at a treatment temperature of 500° C. in oxygen atmosphere for 60 minutes is carried out.

Next, a via hole 256a to the plugs 234, 235, 236 is formed.

More specifically, using the plugs 234, 235, 236 as an etching stopper, the second interlayer insulating film 246 and the protective insulating film 253 are processed by lithography and subsequent dry etching till a part of the surface of the plugs 234, 235, 236 is exposed to form the via hole 256a, for example, having a diameter of about 0.3 μm.

Next, the plugs 254, 255, 256 are formed.

Firstly, after carrying out an RF pretreatment corresponding to several tens nm in terms of etching of a usual oxide film, here around 10 nm, so as to cover respective wall faces of the via holes 254a, 255a, 256a, for example, a TiN film is deposited in a thickness of around 75 nm by a sputtering method to form a base film (glue film) 261. Then, for example, a W film is formed so as to embed the via holes 254a, 255a, 256a via the glue film 261 by a CVD method. After that, the W film and the glue film 261 is polished by CMP using the second interlayer insulating film 246 as a stopper to form the plugs 254, 255, 256 embedding the inside of the via holes 254a, 255a, 256a with W via the glue film 261.

Figure 25C:
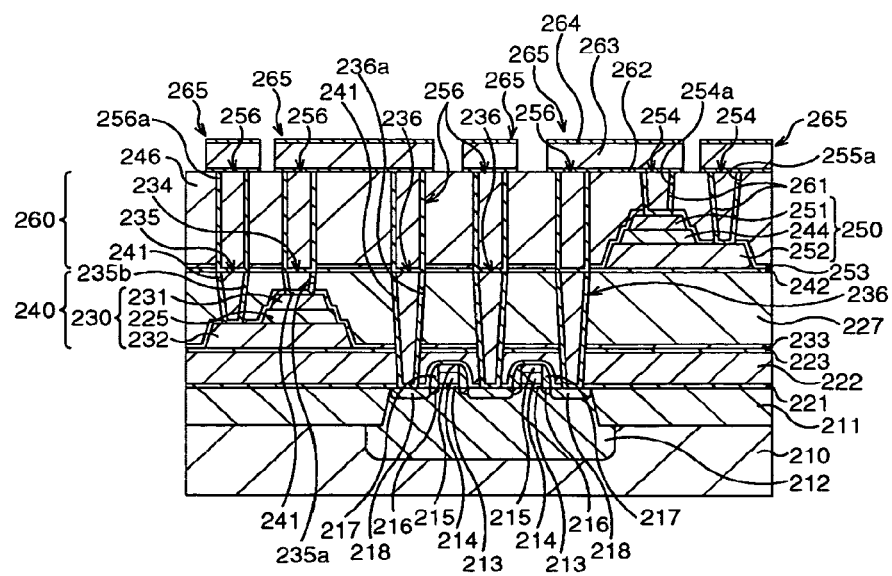

Subsequently, as shown in FIG. 25C, wirings 265 to be connected with the plugs 254, 255, 256 are formed respectively.

More specifically, firstly, by a sputtering method, for example, TiN is deposited in a thickness of around 60 nm to form a barrier metal film 262.

Next, by a sputtering method, for example, an Al—Cu alloy is deposited in a thickness of around 360 nm to form a wiring layer 263.

Next, by a sputtering method, for example, a laminated film of TiN and Ti is deposited in a thickness of around 70 nm to form a barrier metal film 264.

Next, the barrier metal film 262, the wiring layer 263 and the barrier metal film 264 are patterned by lithography and dry etching. By the patterning, respective wirings 265 to be connected to the plugs 254, 255, 256 are formed respectively.

After that, through the formation of an interlayer insulating film, an upper layer wiring, a protective insulating film and the like, the planar type FeRAM according to the second embodiment is completed. In the illustrated example, respective memory cells of the 1T1C structure are constituted respectively by the transistor structure 220a and the ferroelectric capacitor structure 250, and the transistor structure 220b and the ferroelectric capacitor structure 230.

As described above, according to the present embodiment, it becomes possible to realize miniaturization/high integration and increase in the amount of accumulated charges, and to give a planar type FeRAM having a high reliability.

According to the present invention, it becomes possible to realize miniaturization/high integration and increase in an amount of accumulated charges, and to give a memory structure having a high reliability.

What is claimed is:

1. A semiconductor device comprising:
a plural memory cells that respectively include
a capacitor structure formed above a semiconductor substrate and constituted by sandwiching a dielectric film with a lower electrode and an upper electrode, and
a transistor for selecting the capacitor structure,
wherein the capacitor structure of the respective memory cells is respectively formed in either one layer of at least two layers of interlayer insulating films having different heights from a surface of the semiconductor substrate;
wherein between two layers of the interlayer insulating films having been laminated adjacently, a first protective film is formed between a first connecting plug and the lower electrode, a second protective film is formed between the upper electrode and a second connecting plug, and a third protective film is formed between a third connecting plug and a fourth connecting plug,
wherein the first protective film, the second protective film, and the third protective film are formed in an insulating film provided between the two layers of the interlayer insulating films, and
wherein a surface of the first protective film, a surface of the second protective film, a surface of the third protective film, and a surface of the insulating film have the same height from the surface of the semiconductor substrate.

2. The semiconductor device according to claim 1, wherein a thickness of the first protective film, a thickness of the second protective film, and a thickness of the third protective film are the same.

3. The semiconductor device according to claim 1, wherein the surface of the first protective film, the surface of the second protective film, the surface of the third protective film, and the surface of the insulating film form a flat face.

* * * * *